US009064878B2

(12) United States Patent
Lin et al.

(10) Patent No.: US 9,064,878 B2
(45) Date of Patent: Jun. 23, 2015

(54) WIRING BOARD WITH SHIELDING LID AND SHIELDING SLOTS AS ELECTROMAGNETIC SHIELDS FOR EMBEDDED DEVICE

(71) Applicant: Bridge Semiconductor Corporation, Taipei (TW)

(72) Inventors: Charles W. C. Lin, Singapore (SG); Chia-Chung Wang, Hsinchu (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 1 day.

(21) Appl. No.: 14/053,950

(22) Filed: Oct. 15, 2013

(65) Prior Publication Data

US 2014/0048916 A1   Feb. 20, 2014

Related U.S. Application Data

(63) Continuation-in-part of application No. 13/733,226, filed on Jan. 3, 2013, and a continuation-in-part of application No. 13/738,314, filed on Jan. 10, 2013, and a continuation-in-part of application No. 13/753,570, filed on Jan. 30, 2013, and a continuation-in-part of application No. 13/753,589, filed on Jan. 30, 2013, and a continuation-in-part of application No. 13/969,641, filed on Aug. 19, 2013, said application No. 13/969,641 is a continuation-in-part of application No. 13/733,226, filed on Jan. 3, 2013, and a continuation-in-part of application No. 13/738,314, filed on Jan. 10, 2013, and a continuation-in-part of (Continued)

(51) Int. Cl.
*H01L 23/552* (2006.01)
*H01L 23/00* (2006.01)

(52) U.S. Cl.
CPC .............. *H01L 23/552* (2013.01); *H01L 24/19* (2013.01); *H01L 2224/26175* (2013.01); *H01L 2224/73267* (2013.01); *H01L 2224/92144* (2013.01); *H01L 2224/92244* (2013.01); *H01L 24/24* (2013.01); *H01L 24/82* (2013.01); *H01L 2224/24226* (2013.01); *H01L 2224/8314* (2013.01)

(58) Field of Classification Search
CPC ............ H01L 2224/48227; H01L 2224/8314; H01L 23/552; H05K 1/0216; H05K 3/4608
See application file for complete search history.

(56) References Cited

U.S. PATENT DOCUMENTS

| | | | | |
|---|---|---|---|---|
| 5,561,328 A * | 10/1996 | Massingill et al. | ........... | 257/786 |
| 6,205,028 B1 * | 3/2001 | Matsumura | ................... | 361/720 |
| 6,740,959 B2 * | 5/2004 | Alcoe et al. | ................... | 257/659 |
| 7,929,313 B2 * | 4/2011 | Ito et al. | ......................... | 361/765 |
| 7,957,154 B2 * | 6/2011 | Ito et al. | ......................... | 361/765 |
| 8,093,691 B1 * | 1/2012 | Fuentes et al. | ................ | 257/660 |
| 8,102,032 B1 * | 1/2012 | Bolognia et al. | ............. | 257/659 |
| 8,105,782 B2 * | 1/2012 | Guldberg | ..................... | 435/6.12 |
| 8,105,872 B2 | 1/2012 | Pagaila et al. | | |
| 8,168,893 B2 | 5/2012 | Ito et al. | | |
| 8,314,486 B2 * | 11/2012 | Chi et al. | ....................... | 257/710 |
| 8,349,658 B2 * | 1/2013 | Chi et al. | ....................... | 438/123 |
| 8,405,187 B2 * | 3/2013 | Tosaya et al. | ................. | 257/528 |
| 2004/0195701 A1 * | 10/2004 | Attarwala | ..................... | 257/783 |
| 2005/0103609 A1 * | 5/2005 | Fuji | ............................... | 200/305 |
| 2008/0157340 A1 * | 7/2008 | Yang et al. | .................... | 257/691 |

(Continued)

*Primary Examiner* — Evan Pert
*Assistant Examiner* — Gustavo Ramallo
(74) *Attorney, Agent, or Firm* — Bacon & Thomas, PLLC

(57) ABSTRACT

In a preferred embodiment, a wiring board with embedded device and electromagnetic shielding includes a semiconductor device, a core layer, a shielding lid, shielding slots and build-up circuitry. The build-up circuitry covers the semiconductor device and the core layer. The shielding slots and the shielding lid are electrically connected to at least one ground contact pad of the semiconductor device by the build-up circuitry and can respectively serve as effective horizontal and vertical electromagnetic shields for the semiconductor devices.

13 Claims, 20 Drawing Sheets

Related U.S. Application Data application No. 13/753,570, filed on Jan. 30, 2013, and a continuation-in-part of application No. 13/753,589, filed on Jan. 30, 2013, said application No. 13/753,570 is a continuation-in-part of application No. 13/733,226, filed on Jan. 3, 2013, and a continuation-in-part of application No. 13/738,314, filed on Jan. 10, 2013, said application No. 13/753,589 is a continuation-in-part of application No. 13/733,226, filed on Jan. 3, 2013, and a continuation-in-part of application No. 13/738,314, filed on Jan. 10, 2013.

(60) Provisional application No. 61/714,960, filed on Oct. 17, 2012, provisional application No. 61/682,801, filed on Aug. 14, 2012, provisional application No. 61/692,725, filed on Aug. 24, 2012.

(56) References Cited

U.S. PATENT DOCUMENTS

| | | | |
|---|---|---|---|
| 2009/0168363 A1* | 7/2009 | Clayton et al. | 361/714 |
| 2010/0062564 A1* | 3/2010 | Sakaguchi et al. | 438/106 |
| 2011/0157762 A1* | 6/2011 | Kurashima | 361/277 |
| 2012/0120609 A1* | 5/2012 | Chou et al. | 361/708 |
| 2013/0105984 A1* | 5/2013 | Rathburn | 257/773 |

* cited by examiner

WIRING BOARD WITH SHIELDING LID AND SHIELDING SLOTS AS ELECTROMAGNETIC SHIELDS FOR EMBEDDED DEVICE

CROSS REFERENCE TO RELATED APPLICATION

This application is a continuation-in-part of U.S. application Ser. No. 13/733,226 filed Jan. 3, 2013, a continuation-in-part of U.S. application Ser. No. 13/738,314 filed Jan. 10, 2013, a continuation-in-part of U.S. application Ser. No. 13/753,570 filed Jan. 30, 2013, a continuation-in-part of U.S. application Ser. No. 13/753,589 filed Jan. 30, 2013 and a continuation-in-part of U.S. application Ser. No. 13/969,641 filed Aug. 19, 2013, each of which is incorporated by reference. This application also claims the benefit of filing date of U.S. Provisional Application Ser. No. 61/714,960 filed Oct. 17, 2012.

U.S. application Ser. No. 13/969,641 filed Aug. 19, 2013 is a continuation-in-part of U.S. application Ser. No. 13/733,226 filed Jan. 3, 2013, a continuation-in-part of U.S. application Ser. No. 13/738,314 filed Jan. 10, 2013, a continuation-in-part of U.S. application Ser. No. 13/753,570 filed Jan. 30, 2013 and a continuation-in-part of U.S. application Ser. No. 13/753,589 filed Jan. 30, 2013.

U.S. application Ser. No. 13/753,570 filed Jan. 30, 2013 and U.S. application Ser. No. 13/753,589 filed Jan. 30, 2013 are each a continuation-in-part of U.S. application Ser. No. 13/733,226 filed Jan. 3, 2013 and a continuation-in-part of U.S. application Ser. No. 13/738,314 filed Jan. 10, 2013.

U.S. application Ser. No. 13/733,226 filed Jan. 3, 2013, U.S. application Ser. No. 13/738,314 filed Jan. 10, 2013, U.S. application Ser. No. 13/753,570 filed Jan. 30, 2013 and U.S. application Ser. No. 13/753,589 filed Jan. 30, 2013 all claim the benefit of filing date of U.S. Provisional Application Ser. No. 61/682,801 filed Aug. 14, 2012. U.S. application Ser. No. 13/969,641 filed Aug. 19, 2013 claims the benefit of filing date of U.S. Provisional Application Ser. No. 61/692,725 filed Aug. 24, 2012.

BACKGROUND OF THE INVENTION

1. Field of the Invention

The present invention relates to a wiring board with an embedded device and electromagnetic shielding, and more particularly to a wiring board having a shielding lid and shielding slots that can respectively serve as vertical and horizontal shields for the embedded device.

2. Description of Related Art

The semiconductor devices are susceptible to electromagnetic interference (EMI) or other inter-device interference, such as capacitive, inductive, conductive coupling when operated in a high frequency mode. These undesirable interferences may become increasingly serious when the semiconductor dies are placed closely together for the miniaturization purpose. In order to minimize the electromagnetic interference, shielding may be required on certain semiconductor devices and modules.

U.S. Pat. No. 8,102,032 to Bolognia et al., U.S. Pat. No. 8,105,872 to Pagaila et al., U.S. Pat. No. 8,093,691 to Fuentes et al., U.S. Pat. No. 8,314,486 and U.S. Pat. No. 8,349,658 to Chi et al. disclose various methods used for shielding of semiconductor devices including metal cans, wire fences, or ball fences. All of the above approaches are designed for the devices assembled on a substrate and the shielding materials such as metal cans, metal film, wire or ball fences are all external added-on which requires additional space and thus increases the footprint of the semiconductor package and the extra cost.

U.S. Pat. Nos. 7,929,313, 7,957,154 and U.S. Pat. No. 8,168,893 to Ito et al. disclose a method of using conductive via hole in a resin layer to form an electromagnetic shielding layer that surrounds a concave portion for housing an embedded semiconductor device. This structure promises a superior electrical shielding for the embedded devices at minimal space, but the conductive via which needs to be as deep as the thickness of semiconductor device suffers limitations in high aspect ratio of via drilling and via plating and can only accommodate some ultra-thin devices. Furthermore, as the concave portion which serves as the die placement area is formed after the metallization of conductive via, dislocation of semiconductor device due to poor alignment makes this method prohibitively low yield in volume manufacturing.

SUMMARY OF THE INVENTION

The present invention has been developed in view of such a situation, and an object thereof is to provide a wiring board with embedded device and electromagnetic shielding which can effectively shield the embedded device from electromagnetic interference. Accordingly, the present invention provides a wiring board that includes a semiconductor device, a core layer, shielding slots, a shielding lid, a first build-up circuitry, and optionally a second build-up circuitry. Further, the present invention also provide another wiring board that includes a semiconductor device, a core layer, shielding slots, a first build-up circuitry, and a second build-up circuitry with a shielding lid.

In a preferred embodiment, the shielding slots and the shielding lid are electrically connected to at least one ground contact pad of the semiconductor device and can respectively serve as lateral and vertical shields for the semiconductor device. The core layer laterally covers the semiconductor device in lateral directions orthogonal to the vertical directions. The shielding slots each extend through the core layer and laterally cover the semiconductor device. The shielding lid covers the semiconductor device in the second vertical direction. The first build-up circuitry and the second build-up circuitry cover the semiconductor device and the core layer from the first and second vertical directions, respectively.

The wiring board of the present invention can further include a stopper that serves as a placement guide for the semiconductor device. The stopper is in close proximity to and laterally aligned with peripheral edges of the semiconductor device in lateral directions. The stopper can contact and extend from the shielding lid or an insulating layer of the second build-up circuitry in the first vertical direction, or extend from an insulating layer of the first build-up circuitry in the second vertical direction. For instance, the stopper may extend from an insulating layer of the second build-up circuitry or the shielding lid and extend beyond the inactive surface of the semiconductor device in the first vertical direction, or extend from an insulating layer of the first build-up circuitry and extend beyond the active surface of the semiconductor device in the second vertical direction. In any case, the stopper is located beyond peripheral edges of the semiconductor device and is in close proximity to peripheral edges of the semiconductor device.

The semiconductor device includes an active surface with a plurality of contact pads thereon and an inactive surface opposite to the active surface. The active surface of the semiconductor device faces the first vertical direction away from the second build-up circuitry or the shielding lid, and the inactive surface of the semiconductor device faces the second vertical direction toward the second build-up circuitry or the shielding lid. The semiconductor device can be affixed on the first or second build-up circuitry or mounted on the shielding lid by an adhesive.

The core layer can contact and surround and conformally coat the sidewall of the semiconductor device and the stopper, and extend laterally from the semiconductor device and the stopper to peripheral edges of the wiring board. The core layer can be made of pre-preg materials such as epoxy, BT, polyimide and other kind of resins or resin/glass composite.

The shielding slots can extend from the first build-up circuitry to the shielding lid or the stopper in the second vertical direction. For instance, the shielding slots at a first end can extend to and be electrically connected to an outer or inner conductive layer of the first build-up circuitry, and at a second end can extend to and be electrically connected to the shielding lid or the stopper. As an another aspect, the shielding slots may extend from the second build-up circuitry to the stopper in the first vertical direction. For instance, the shielding slots at a first end can extend to and be electrically connected to the stopper, and at a second end can extend to and be electrically connected to the shielding lid of the second build-up circuitry. The shielding slots spaced from the first build-up circuitry can be electrically connected to the first build-up circuitry by conductive vias in electrical contact with the stopper or by one or more plated through holes in electrical contact with the shielding lid and the first build-up circuitry. In any case, the shielding slots extend through the core layer and laterally cover the semiconductor device, and can be electrically connected to at least one ground contact pad of the semiconductor device by the first build-up circuitry. The shielding slots can be provided by forming slot openings that extend through the core layer and then plating the inner sidewalls of the slot openings. Each shielding slot can be a continuous metallized slot and can have an open end that faces the first or second vertical direction. In order to provide effective lateral EMI shielding, each shielding slot at both lateral ends preferably extends laterally beyond peripheral edges of the semiconductor device outward and even extend laterally to peripheral edges of the wiring board along each lateral peripheral edge of the semiconductor device. For instance, the wiring board can be designed with four shielding slots each continuously extending beyond peripheral edges of the semiconductor device in the lateral direction along four lateral sides of the semiconductor device. Accordingly, the shielding slots can completely cover the lateral surfaces of the semiconductor device so as to minimize the lateral electromagnetic interference. Alternatively, the lateral surfaces of the semiconductor device may be completely covered by the combination of the stopper and the shielding slots in the aspect of the shielding slots extending to the stopper.

The shielding lid is aligned with and covers the semiconductor device from the second vertical direction and can be electrically connected to at least one ground contact pad of the semiconductor device by the first build-up circuitry. The shielding lid can be a continuous metal layer and preferably laterally extends at least to a perimeter coincident with peripheral edges of the semiconductor device in order to provide effective vertical EMI shielding. For instance, the shielding lid can laterally extend to be coplanar with peripheral edges of the semiconductor device in the lateral directions, or laterally extend beyond peripheral edges of the semiconductor device outward and even laterally extend to peripheral edges of the wiring board. Accordingly, the shielding lid can completely cover the semiconductor device from the second vertical direction to minimize the vertical electromagnetic interference. The shielding lid spaced from the first build-up circuitry can be electrically connected to the first build-up circuitry by the shielding slots in electrical connection with the first build-up circuitry. For instance, in accordance with one aspect of the wiring board with the shielding slots at the second end extending to the shielding lid, the shielding slots contact the shielding lid and can provide an electrical connection between the shielding lid and the first build-up circuitry. Also, the shielding lid may be electrically connected to the first build-up circuitry by the stopper and the shielding slots in accordance with another aspect where the stopper extends from the shielding lid in the first vertical direction and the shielding slots at the second end extend to the stopper. As for yet another aspect of the wiring board with the shielding slots at the second end extending to the stopper that is spaced from the shielding lid by an insulating layer of the second build-up circuitry, the shielding lid can be electrically connected to the stopper through conductive vias or conductive trenches of the second build-up circuitry, and thus the combination of the shielding slots, the stopper and the conductive vias or conductive trenches can provide an electrical connection between the shielding lid and the first build-up circuitry. As an alternative, the shielding lid may be electrically connected to the first build-up circuitry by one or more plated through holes that extend through the core layer. For instance, the plated through hole at a first end can extend to and be electrically connected to the first build-up circuitry, and at a second end can extend to and electrically connected to the shielding lid. As a result, the plated through hole can provide an electrical connection between the shielding lid and the first build-up circuitry.

The first build-up circuitry covers the semiconductor device and the core layer from the first vertical direction and can include a first insulating layer and one or more first conductive traces. For instance, the first insulating layer covers the semiconductor device and the core layer in the first vertical direction and can extend to peripheral edges of the wiring board, and the first conductive traces extend from the first insulating layer in the first vertical direction. The first insulating layer can include first via openings that are disposed adjacent to the contact pads of the semiconductor device. One or more first conductive traces extend from the first insulating layer in the first vertical direction and extend laterally on the first insulating layer and extend into the first via openings in the second vertical direction to form first conductive vias, thereby providing signal routing for signal contact pads of the semiconductor device and ground connection for ground contact pads of the semiconductor device. Further, in the aspect of the wiring board with the stopper extending from the first insulating layer in the first vertical direction, the first insulating layer can further include one or more additional first via openings that are disposed adjacent to selected portions of the stopper. The first conductive traces can further extend into the additional first via openings in the second vertical direction to form one or more additional first conductive vias in electrical contact with the stopper, thereby providing ground connection between ground contact pads of semiconductor device and the stopper. As a result, the shielding slots in electrical contact with the stopper can be electrically connected to the ground contact pad of the semiconductor device by the stopper and the first conductive vias. In summary, the first build-up circuitry is electrically connected to the contact pads of the semiconductor device through the first conductive vias to provide signal routing and ground connection for the semiconductor device, and can be further electrically connected to the stopper through the additional first conductive vias to provide the ground connection for the stopper. As the first conductive traces can directly contact the contact pads of the semiconductor device and the stopper, the electrical connection between the semiconductor device and the first build-up circuitry and between the stopper and the first build-up circuitry can be devoid of solder.

The second build-up circuitry can be optionally provided and cover the shielding lid and the core layer from the second vertical direction in accordance with one aspect of the wiring board with the semiconductor device mounted on the shielding lid. In this aspect, the second build-up circuitry can include a second insulating layer and one or more second conductive traces. For instance, the second insulating layer covers the shielding lid and the core layer from the second vertical direction and can extend to peripheral edges of the wiring board, and the second conductive traces extend from the second insulating layer in the second vertical direction and extend laterally on the second insulating layer. The second insulating layer can include one or more second via openings that are disposed adjacent to selected portions of the shielding lid. The second conductive traces can further extend into the second via openings in the first vertical direction to form one or more second conductive vias, thereby providing electrical connection for the shielding lid. As for another aspect of the wiring board with the shielding lid built in the second build-up circuitry, the second build-up circuitry covers the semiconductor device and the core layer from the second vertical direction and can include a second insulating layer, the shielding lid and optionally second conductive traces. For instance, the second insulating layer covers the semiconductor device and the core layer from the second vertical direction and can extend to peripheral edges of the wiring board, and the shielding lid and the second conductive traces extend from the second insulating layer in the second vertical direction and laterally extend on the second insulating layer. In the aspect of the wiring board with the stopper extending from the second insulating layer in the first vertical direction, the second insulating layer can include one or more second via openings or trench openings that are disposed adjacent to selected portions of the stopper and can be metallized to form one or more second conductive vias or conductive trenches. Accordingly, the shielding lid can be electrically connected to the first build-up circuitry for ground connection through the shielding slots, the stopper, and the second conductive via or the conductive trench in the case of the shielding slots at the second end extending to the stopper. As for another aspect of the wiring board with the shielding slots extending from the first build-up circuitry to the shielding lid of the second build-up circuitry, the shielding lid can be electrically connected to the first build-up circuitry by the shielding slots.

The first and second build-up circuitry can include additional layers of dielectric, additional layers of via openings, and additional layers of conductive traces if needed for further signal routing. For instance, the first build-up circuitry can further include a third insulating layer and third conductive traces. The third insulating layer extends from the first insulating layer and the first conductive traces in the first vertical direction and can extend to peripheral edges of the wiring board, and the third conductive traces extend from the third insulating layer in the first vertical direction. In the aspect of the shielding slots at the first end extending to first conductive traces and having an open end toward the first vertical direction, the third insulating layer can further extend into the shielding slots from the open end of the shielding slots. The outmost conductive traces of the first and second build-up circuitries can respectively include one or more first and second interconnect pads to provide electrical contacts for an electronic device such as a semiconductor chip, a plastic package or another semiconductor assembly. The first interconnect pads can include an exposed contact surface that faces in the first vertical direction, while the second interconnect pads can include an exposed contact surface that faces in the second vertical direction. As a result, the wiring board can include electrical contacts (i.e. the first and second interconnect pads) that are electrically connected to one another and located on opposite surfaces that face in opposite vertical directions, so that the wiring board is stackable and electronic devices can be electrically connected to the wiring board using a wide variety of connection media including wire bonding or solder bumps as the electrical contacts.

The wiring board of the present invention can further include one or more plated through holes that extend through the core layer. The plated through hole can provide an electrical connection between the first build-up circuitry and the second build-up circuitry. For instance, the plated through hole at a first end can extend to and be electrically connected to an outer or inner conductive layer of the first build-up circuitry, and at a second end can extend to and be electrically connected to an outer or inner conductive layer or the shielding lid of the second build-up circuitry. As a result, the plated through hole can provide electrical connection in vertical directions for signal routing or ground connection.

The stopper can be made of a metal, a photosensitive plastic material or non-photosensitive material. For instance, the stopper can consist essentially of copper, aluminum, nickel, iron, tin or their alloys. The stopper can also consist of epoxy or polyimide. Further, the stopper can have patterns against undesirable movement of the semiconductor device. For instance, the stopper can include a continuous or discontinuous strip or an array of posts. Specifically, the stopper can be laterally aligned with four lateral surfaces of the semiconductor device to stop the lateral displacement of the semiconductor device. For instance, the stopper can be aligned along and conform to four sides, two diagonal corners or four corners of the semiconductor device, and a gap in between the semiconductor device and the stopper preferably is in a range of about 0.001 to 1 mm. As a result, the stopper located between the shielding slots and the semiconductor device can prevent the location error of the semiconductor device from exceeding the maximum acceptable error limit. Further, in the aspect of the shielding slots extending to the stopper, the stopper can also serve as a portion of the horizontal shield for the semiconductor device. Besides, the stopper preferably has a thickness in a range of 10-200 microns.

The present invention also provides a three-dimensional stacking module in which plural wiring boards each with embedded device and electromagnetic shielding are stacked in back-to-back or face-to-back manner using interlayer dielectric between each two neighboring wiring boards and are electrically connected to one another through one or more plated through holes.

The present invention has numerous advantages. The shielding slots and the shielding lid can respectively serve as horizontal and vertical EMI shields for semiconductor device to minimize electromagnetic interference. The electrical connection between ground contact pads of the semiconductor device and the shielding slots/shielding lid can be provided by the build-up circuitry to provide effective electromagnetic shielding effect for the semiconductor device embedded in the wiring board. The signal routing can be provided by the build-up circuitry and is advantageous for high I/O and high performance applications due to the high routing capability of the build-up circuitry. Further, the stopper can be optionally provided in the wiring board based on actual demand. For instance, in the case of embedding a chip with fine pitch in the wiring board, the stopper can be provided to accurately confine the placement location of the chip and thus to avoid the electrical connection failure between the chip and the build-up circuitry resulted from the lateral displacement of the chip, thereby improving the manufacturing yield greatly. The wiring board and the stacking module using the same are reliable, inexpensive and well-suited for high volume manufacture.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which:

FIGS. 1-5 are cross-sectional views showing a method of making a wiring board that includes a stopper, a semiconductor device, a core layer, a shielding lid, shielding slots, terminals, build-up circuitry and plated through holes in accordance with an embodiment of the present invention, in which

FIGS. 26'-27' are cross-sectional views of another modified aspect corresponding to FIGS. 26-27;

FIGS. 31-33 are cross-sectional views showing a method of making yet another wiring board in which a shielding lid is electrically connected to first build-up circuitry by conductive trenches in contact with a stopper in accordance with yet another embodiment of the present invention, in which

FIGS. 33' is a cross-sectional view of another modified aspect corresponding to FIGS. 33;

DETAILED DESCRIPTION OF THE PREFERRED EMBODIMENT

Hereafter, examples will be provided to illustrate the embodiments of the present invention. Other advantages and effects of the invention will become more apparent from the disclosure of the present invention. It should be noted that these accompanying figures are simplified. The quantity, shape and size of components shown in the figures may be modified according to practically conditions, and the arrangement of components may be more complex. Other various aspects also may be practiced or applied in the invention, and various modifications and variations can be made without departing from the spirit of the invention based on various concepts and applications.

[Embodiment 1]

FIGS. 1-5 are cross-sectional views showing a method of making a wiring board that includes a stopper, a semiconductor device, a core layer, a shielding lid, shielding slots, terminals, build-up circuitry and plated through holes 515 in accordance with an embodiment of the present invention.

Figure 5:
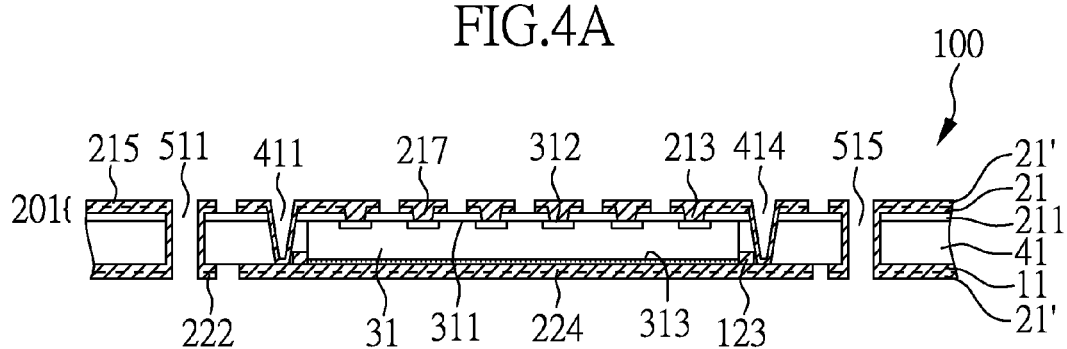

As shown in FIG. 5, wiring board 100 includes stopper 123, semiconductor device 31, core layer 41, shielding lid 224, shielding slots 414, terminals 222, build-up circuitry 201, and plated through holes 515. Semiconductor device 31 includes active surface 311, inactive surface 313 opposite to active surface 311, and contact pads 312 at active surface 311. Stopper 123 is located beyond and in close proximity to peripheral edges of semiconductor device 31. Core layer 41 laterally covers stopper 123 and semiconductor device 31 and laterally extends to peripheral edges of wiring board 100. Build-up circuitry 201 includes first insulating layer 211 and first conductive traces 215 and is electrically connected to semiconductor device 31 through first conductive traces 215. Shielding slots 414 extend from first conductive traces 215 to shielding lid 224 in the downward direction and laterally cover semiconductor device 31. Shielding lid 224 covers semiconductor device 31 in the downward direction. Terminals 222 extend from core layer 41 in the downward direction and are spaced from shielding lid 224. Plated through holes 515 extend through build-up circuitry 201 and core layer 41 and provide electrical connection between build-up circuitry 201 and terminals 222.

Figure 1:
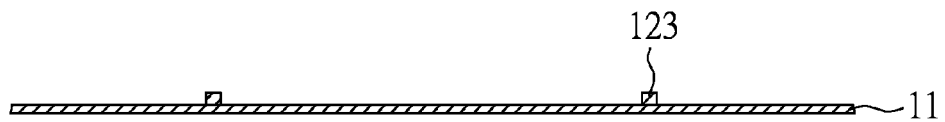
Figure 1A:
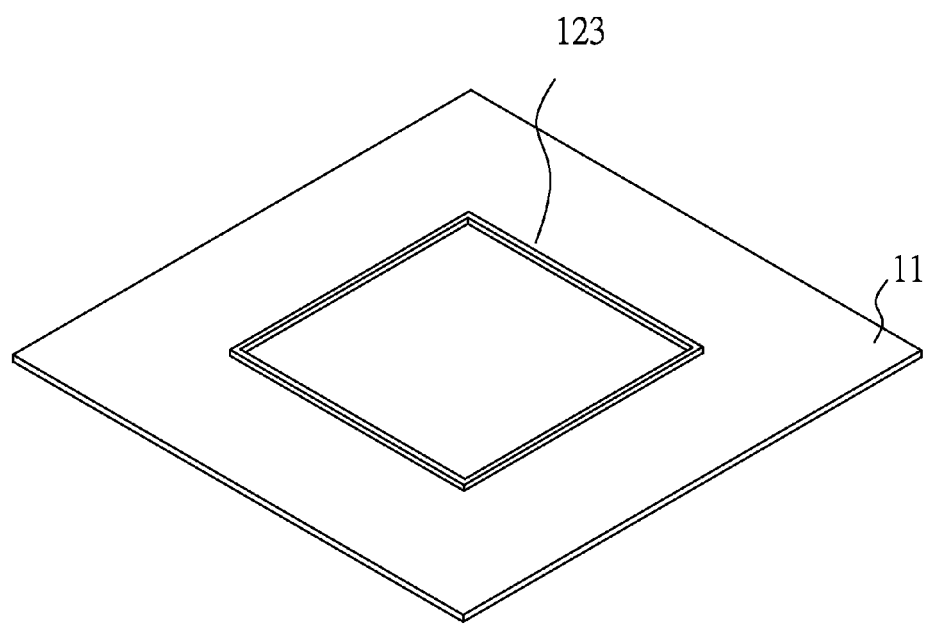
FIGS. 1A, 2A and 4A are top perspective views corresponding to FIGS. 1, 2 and 4, and FIGS. 1B-1G are top perspective views of other various patterns of the stopper for reference.

FIGS. 1 and 1A are cross-sectional and top perspective views, respectively, of the structure with stopper 123 formed on metal layer 11. Metal layer 11 typically is made of copper, but copper alloys or other materials are also doable. The thickness of metal layer 11 can range from 5 to 200 microns. In this embodiment, metal layer 11 is illustrated as a copper plate with a thickness of 50 microns. Stopper 123 can be pattern deposited on metal layer 11 by numerous techniques including electroplating, electroless plating, evaporating, sputtering and their combinations using photolithographic process. Stopper 123 typically is made of copper, but other various metal materials are also doable. Further, stopper 123 preferably has a thickness in a range of 10 to 200 microns. In this illustration, stopper 123 consists of a continuous copper strip with a thickness of 35 microns and conforms to four sides of a semiconductor device subsequently disposed on metal layer 11. However, stopper patterns are not limited thereto and can be other various patterns against undesirable movement of the subsequently disposed semiconductor device.

Figure 1B:
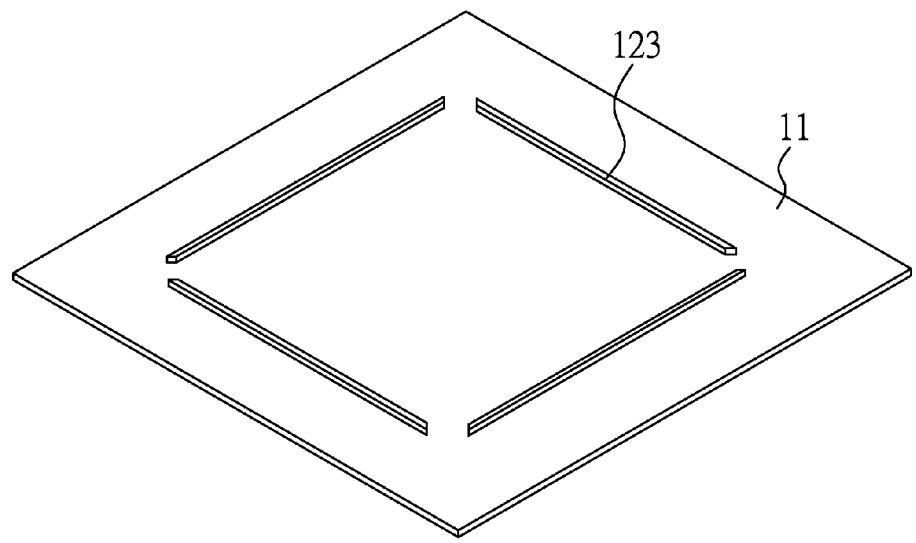
Figure 1C:
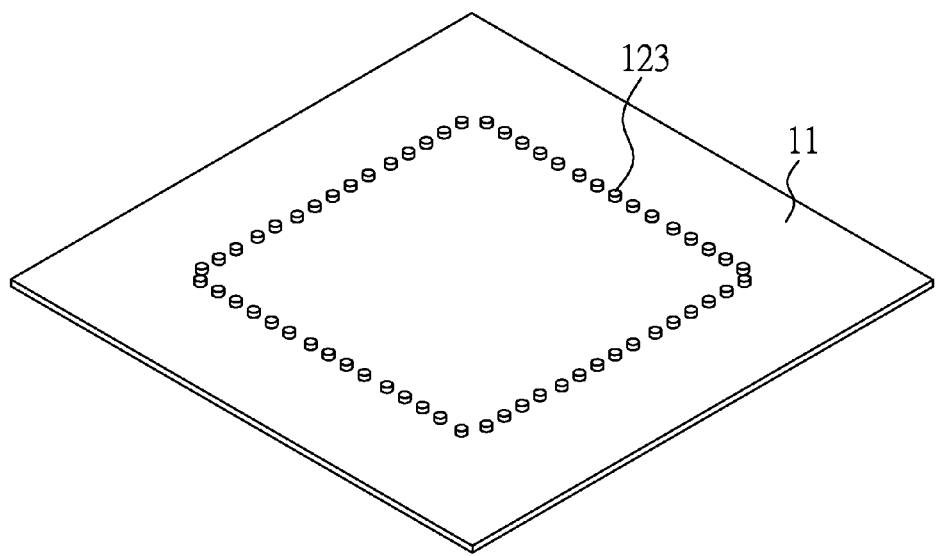
Figure 1D:
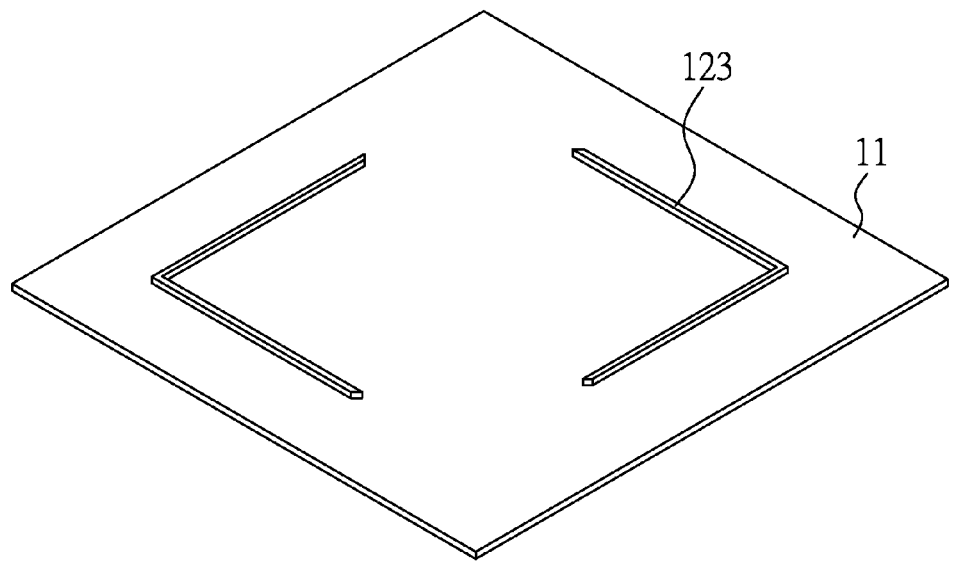
Figure 1E:
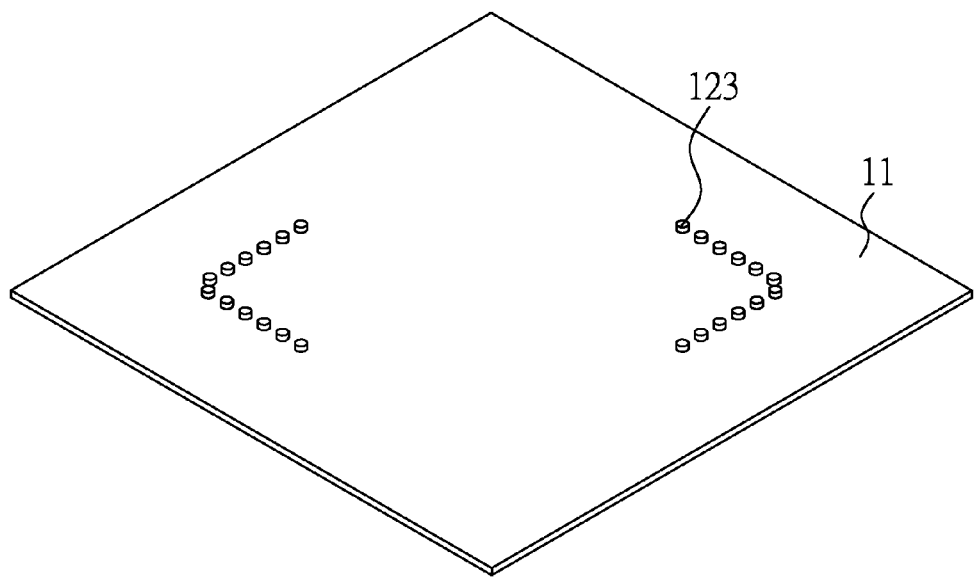
Figure 1F:
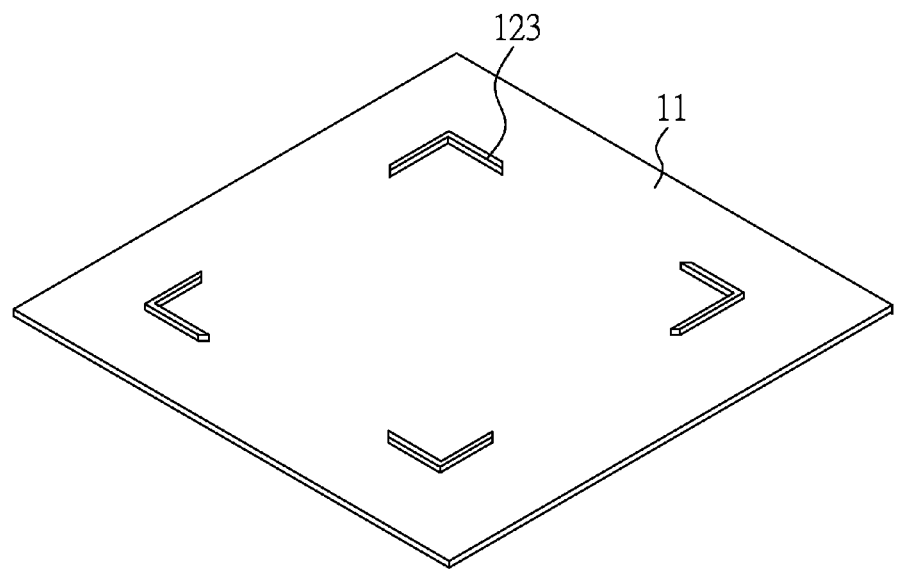
Figure 1G:
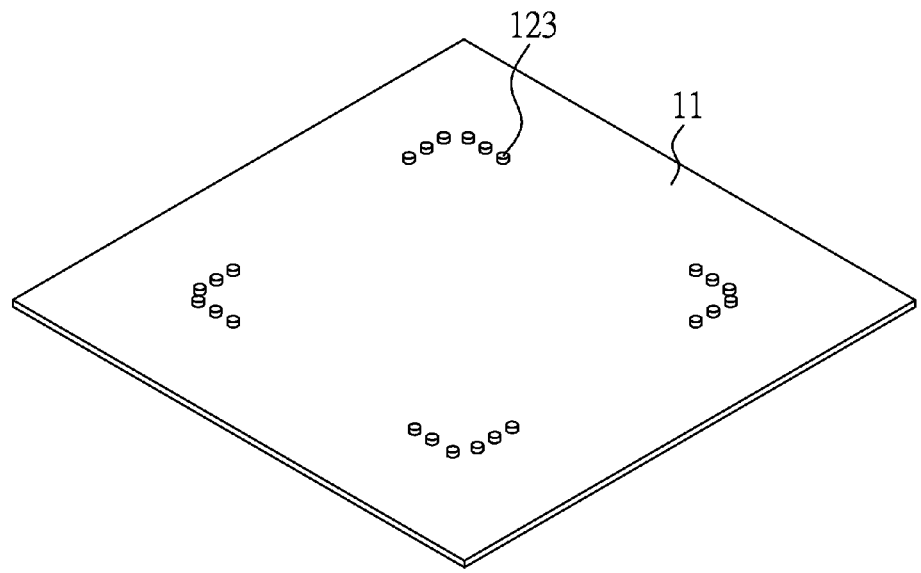

FIGS. 1B-1G are top perspective views of other various stopper patterns for reference. For instance, stopper 123 may consist of a discontinuous strip (as shown in FIGS. 1B, 1D and 1F) or an array of plural metal posts (as shown in FIGS. 1C, 1E and 1G) and conform to four sides (as shown FIGS. 1B and 1C), two diagonal corners (as shown in FIGS. 1D and 1E), or four corners (as shown in FIGS. 1F and 1G) of a subsequently disposed semiconductor device.

Figure 2:
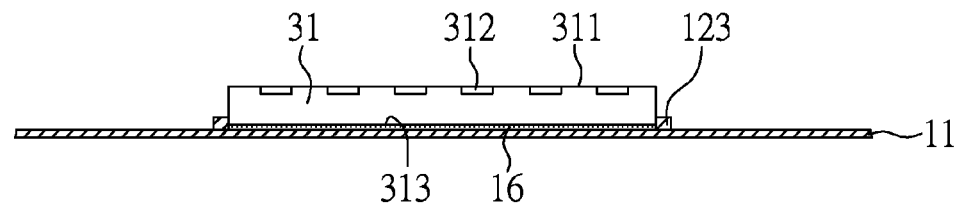
Figure 2A:
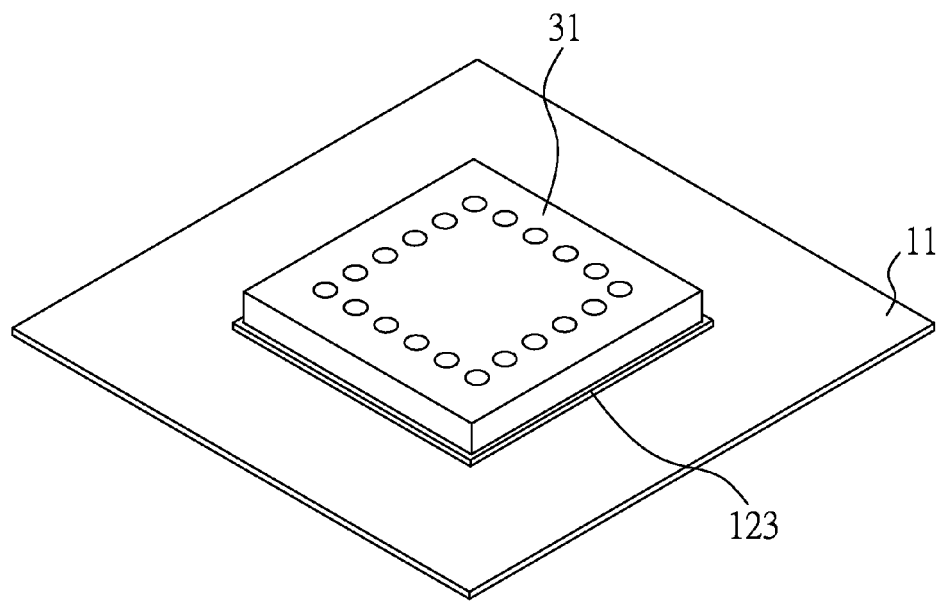

FIGS. 2 and 2A are cross-sectional and top perspective views, respectively, of the structure with semiconductor device 31 mounted on metal layer 11 using adhesive 16 that is sandwiched between and contacts metal layer 11 and semiconductor device 31. Semiconductor device 31 includes active surface 311, inactive surface 313 opposite to active surface 311, and plural contact pads 312 at active surface 311. Stopper 123 can serve as a placement guide for semiconductor device 31, and thus semiconductor device 31 is precisely placed at a predetermined location with its inactive surface 313 facing metal layer 11. Stopper 123 extends from metal layer 11 beyond inactive surface 313 of semiconductor device 31 in the upward direction and laterally aligned with four sides of semiconductor device 31. As stopper 123 is in close proximity to and conforms to four lateral surfaces of semiconductor device 31 in lateral directions and adhesive 16 under semiconductor device 31 is lower than stopper 123, any undesirable movement of semiconductor device 31 due to adhesive curing can be avoided. Preferably, a gap in between semiconductor device 31 and stopper 123 is in a range of about 0.001 to 1 mm. However, for semiconductor devices with coarse pitch, as the device displacement caused by adhesive curing mostly would not result in microvia connection failure, stopper 123 can also be omitted and semiconductor device 31 can be attached on metal layer 11 by any known alignment technique.

Figure 3:
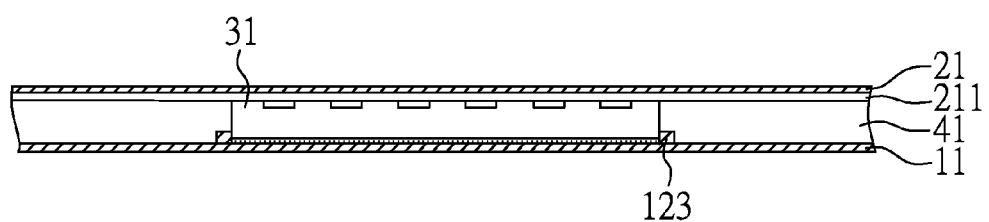

FIG. 3 is a cross-sectional view of the structure laminated with core layer 41, first insulating layer 211 and metal layer 21. Core layer 41 is laminated with semiconductor device 31, stopper 123 and metal layer 11 under pressure and heat and then is solidified. As a result, core layer 41 contacts and extends from stopper 123 and metal layer 11 in the upward direction and laterally covers and surrounds and conformally coats the peripheral side surfaces of semiconductor device 31 and stopper 123 and extends laterally from semiconductor device 31 and stopper 123 to peripheral edges of the structure. First insulating layer 211 contacts and is laminated between metal layer 21 and semiconductor device 31 and between metal layer 21 and core layer 41. First insulating layer 211 typically has a thickness of 50 microns. Metal layer 21 is illustrated as a copper layer with a thickness of 17 microns. Under pressure and heat, first insulating layer 211 is melt and compressed by applying downward pressure to metal layer 21 or/and upward pressure to metal layer 11. Accordingly, first insulating layer 211 as solidified provides secure robust mechanical bonds between metal layer 21 and semiconductor device 31 and between metal layer 21 and core layer 41. Core layer 41 and first insulating layer 211 can be epoxy resin, glass-epoxy, polyimide and the like.

Figure 4:
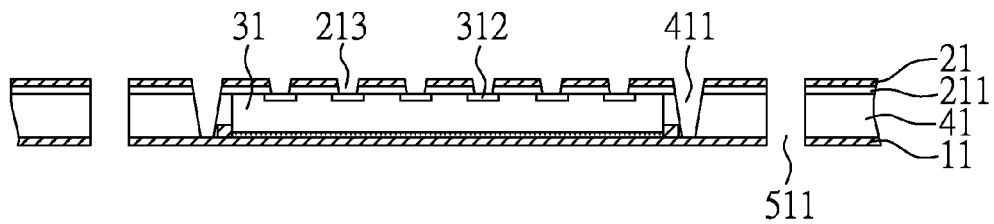
Figure 4A:
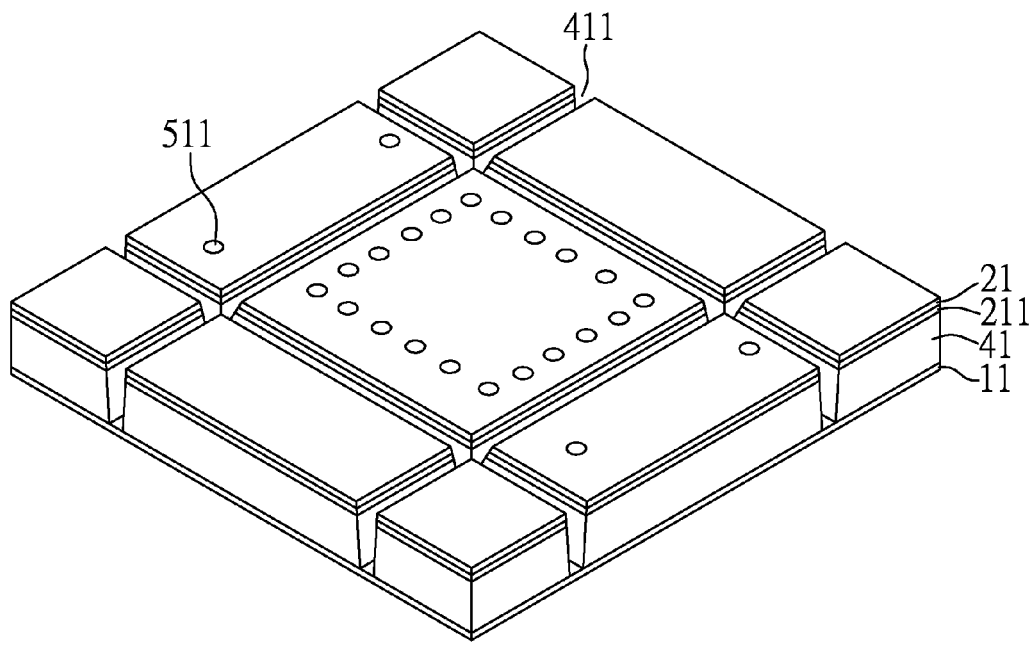

FIGS. 4 and 4A are cross-sectional and top perspective views, respectively, of the structure provided with first via openings 213, slot openings 411 and through holes 511. First via openings 213 extend through metal layer 21 and first insulating layer 211 and are aligned with contact pads 312 of semiconductor device 31. First via openings 213 may be formed by numerous techniques including laser drilling, plasma etching and photolithography, and typically have a diameter of 50 microns. Laser drilling can be enhanced by a pulsed laser. Alternatively, a scanning laser beam with a metal mask can be used. For instance, copper can be etched first to create a metal window followed by laser. Slot openings 411 extend through metal layer 21, first insulating layer 211 and core layer 41 to expose selected portions of metal layer 11. As shown in FIG. 4A, slot openings 411 are formed by mechanically cutting through metal layer 21, first insulating layer 211 and core layer 41 along four cutting lines aligned with four lateral sides of semiconductor device 31. Through holes 511 extend through metal layer 21, first insulating layer 211, core layer 41 and metal layer 11 in the vertical direction. Through holes 511 are formed by mechanical drilling and can be formed by other techniques such as laser drilling and plasma etching with or without wet etching.

Referring now to FIG. 5, first conductive traces 215 are formed on first insulating layer 211 by depositing first plated layer 21' on metal layer 21 and into first via openings 213 and then patterning metal layer 21 and first plated layer 21' thereon. Alternatively, when no metal layer 21 is laminated on first insulating layer 211 in the previous process, first insulating layer 211 can be directly metallized to form first conductive traces 215. First conductive traces 215 extend from first insulating layer 211 in the upward direction, extend laterally on first insulating layer 211 and extend into first via openings 213 in the downward direction to form first conductive vias 217 in direct contact with contact pads 312. As a result, first conductive traces 215 can provide signal routing and ground connection for semiconductor device 31.

Also shown in FIG. 5 is first plated layer 21' deposited in slot openings 411 and through holes 511 to provide shielding slots 414 and plated through holes 515 and further deposited on metal layer 11. Terminals 222 and shielding lid 224 are defined by patterning metal layer 11 and first plated layer 21' at the bottom surface of the structure. Shielding slots 414 extend from first conductive traces 215 to shielding lid 224 in the downward direction and laterally cover semiconductor device 31 and serves as a horizontal EMI shield for semiconductor device 31. Shielding lid 224 covers semiconductor device 31, stopper 123 and shielding slots 414 in the downward direction and serves as a vertical EMI shield for semiconductor device 31. Terminals 222 are spaced from shielding lid 224 and electrically connected to first conductive traces 215 by plated through holes 515.

First plated layer 21' can be deposited by numerous techniques including electroplating, electroless plating, evaporating, sputtering, and their combinations as a single layer or multiple layers. For instance, it is deposited by first dipping the structure in an activator solution to render the insulating layer catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form first conductive traces 215, terminals 222 and shielding lid 224 by numerous techniques including wet etching, electro-chemical etching, laser-assist etching, and their combinations with an etch masks (not shown) thereon that define first conductive traces 215, terminals 222 and shielding lid 224.

Metal layers 11, 21 and first plated layer 21' are shown as a single layer for convenience of illustration. The boundary (shown in phantom) between the metal layers may be difficult or impossible to detect since copper is plated on copper.

However, the boundaries between first plated layer 21' and first insulating layer 211 and between first plated layer 21' and core layer 41 are clear.

Accordingly, as shown in FIG. 5, wiring board 100 is accomplished and includes stopper 123, semiconductor device 31, core layer 41, shielding lid 224, shielding slots 414, build-up circuitry 201, terminals 222 and plated through holes 515. In this illustration, build-up circuitry 201 includes first insulating layer 211 and first conductive traces 215, and plated through holes 515 are essentially shared by core layer 41, build-up circuitry 201 and terminals 222. Semiconductor device 31 is affixed on shielding lid 224 at the predetermined location using stopper 123 as a placement guide and is laterally enclosed by shielding slots 414 that extend from first conductive traces 215 downward to shielding lid 224 and laterally extend beyond peripheral edges of semiconductor device 31 outward. Shielding slots 414 have an open side toward the upward direction and are electrically connected to ground contact pads of semiconductor device 31 by first conductive traces 215 and can serve as a horizontal shield for semiconductor device 31. Shielding lid 224 is electrically connected to ground contact pads of semiconductor device 31 by shielding slots 414 in electrical contact with shielding lid 224 and first conductive traces 215 and can serve as a vertical shield for semiconductor device 31. Plated through holes 515 provide an electrical connection between the build-up circuitry 201 and terminals 222 that extend from core layer 41 in the downward direction.

[Embodiment 2]

FIGS. 6-15 are cross-sectional views showing a method of making another wiring board that includes a stopper, a semiconductor device, a core layer, a shielding lid, shielding slots, dual build-up circuitries and plated through holes in accordance with another embodiment of the present invention.

For purposes of brevity, any description in Embodiment 1 is incorporated herein insofar as the same is applicable, and the same description need not be repeated.

Figure 6:
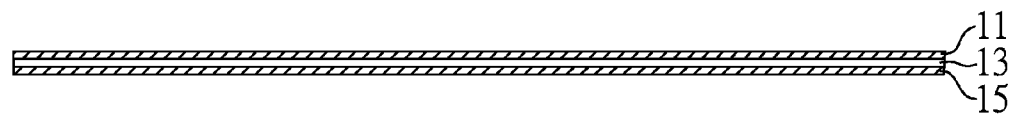
FIGS. 6-15 are cross-sectional views showing a method of making another wiring board that includes a stopper, a semiconductor device, a core layer, a shielding lid, shielding slots, dual build-up circuitries and plated through holes in accordance with another embodiment of the present invention.

FIG. 6 is a cross-sectional view of a laminate substrate that includes metal layer 11, dielectric layer 13 and support plate 15. Dielectric layer 13 typically is made of epoxy resin, glass-epoxy, polyimide and the like and has a thickness of 50 microns. In this embodiment, dielectric layer 13 is sandwiched between metal layer 11 and support plate 15. However, support plate 15 may be omitted in some embodiments. Support plate 15 typically is made of copper, but copper alloys or other materials are also doable. The thickness of support plate 15 can range from 25 to 1000 microns, and preferably ranges from 35 to 100 microns in consideration of process and cost. In this embodiment, support plate 15 is illustrated as a copper plate with a thickness of 35 microns.

Figure 7:
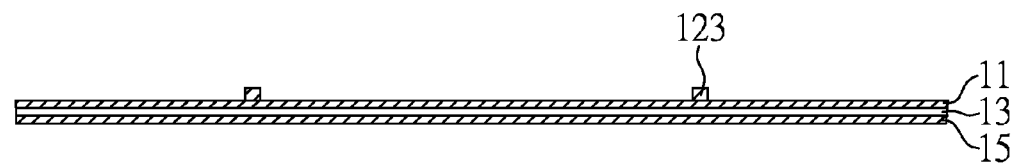

FIG. 7 is a cross-sectional view of the structure with stopper 123 formed on metal layer 11. Stopper 123 can be pattern deposited on metal layer 11 by numerous techniques including electroplating, electroless plating, evaporating, sputtering and their combinations using photolithographic process.

Figure 8:
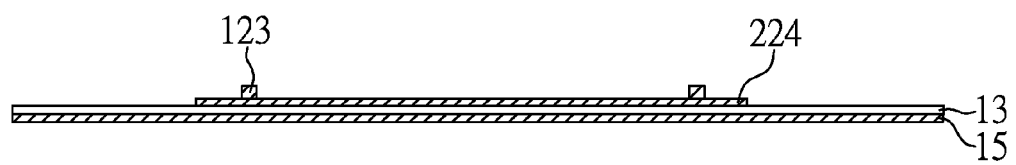

FIG. 8 is a cross-sectional view of the structure with shielding lid 224 defined on dielectric layer 13. Shielding lid 224 can be formed by removing selected portions of metal layer 11 using photolithography and wet etching. Shielding lid 224 corresponds to the predetermined location for placing a semiconductor device and can serve as a vertical EMI shield.

Figure 9:
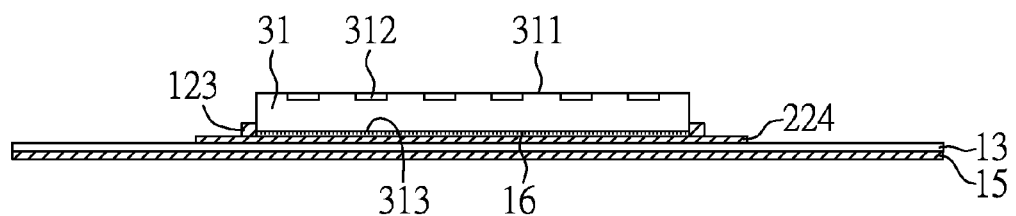

FIG. 9 is a cross-sectional view of the structure with semiconductor device 31 mounted on shielding lid 224 using adhesive 16 that is sandwiched between and contacts shielding lid 224 and semiconductor device 31. Semiconductor device 31 is attached onto shielding lid 224 with its inactive surface 313 facing shielding lid 224. Stopper 123 extends from shielding lid 224 and extends beyond inactive surface 313 of semiconductor device 31 in the upward direction and is in close proximity to peripheral edges of semiconductor device 31 to serve as a placement guide for semiconductor device 31.

Figure 10:
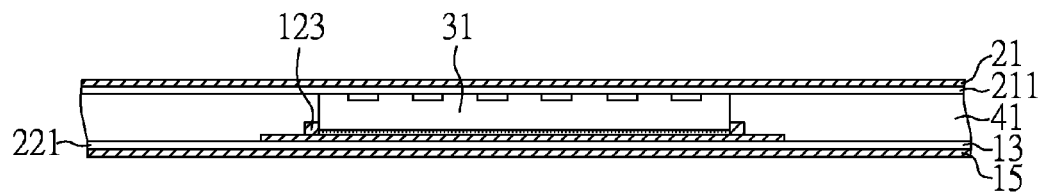

FIG. 10 is a cross-sectional view of the structure laminated with core layer 41, first insulating layer 211 and metal layer 21. Core layer 41 contacts and is laminated with semiconductor device 31, stopper 123, shielding lid 224 and dielectric layer 13. First insulating layer 211 contacts and provides robust mechanical bonds between metal layer 21 and semiconductor device 31 and between metal layer 21 and core layer 41. Preferably, first insulating layer 211 has the same material with dielectric layer 13 that is considered second insulating layer 221.

Figure 11:
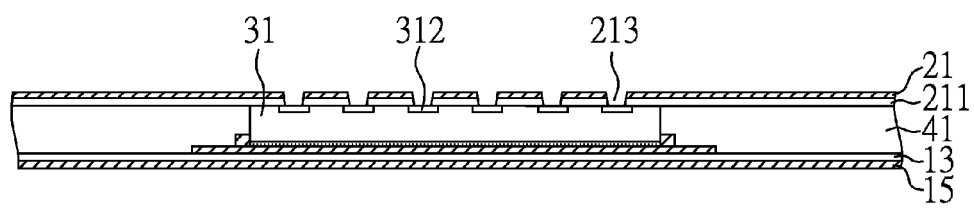

FIG. 11 is a cross-sectional view of the structure provided with first via openings 213. First via openings 213 extend through metal layer 21 and first insulating layer 211 to expose contact pads 312 of semiconductor device 31.

Figure 12:
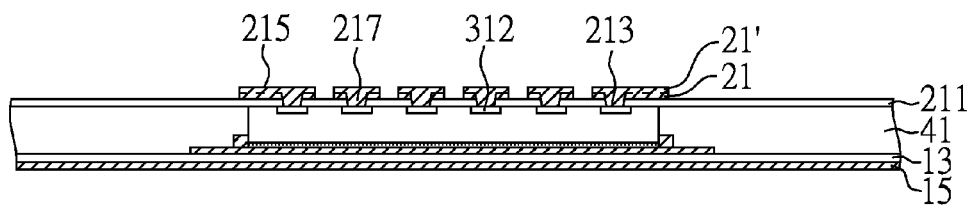

Referring now to FIG. 12, first conductive traces 215 are formed on first insulating layer 211 by depositing first plated layer 21' on metal layer 21 and into first via openings 213, and then patterning metal layer 21 as well as first plated layer 21' thereon. First conductive traces 215 extend from first insulating layer 211 in the upward direction, extend laterally on first insulating layer 211 and extend into first via openings 213 in the downward direction to form first conductive vias 217 in direct contact with contact pads 312.

Figure 13:
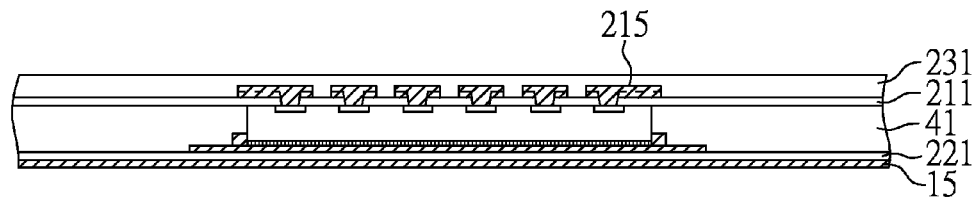

FIG. 13 is a cross-sectional view of the structure laminated with third insulating layer 231. Third insulating layer 231 contacts and covers first insulating layer 211 and first conductive traces 215 in the upward direction.

Figure 14:
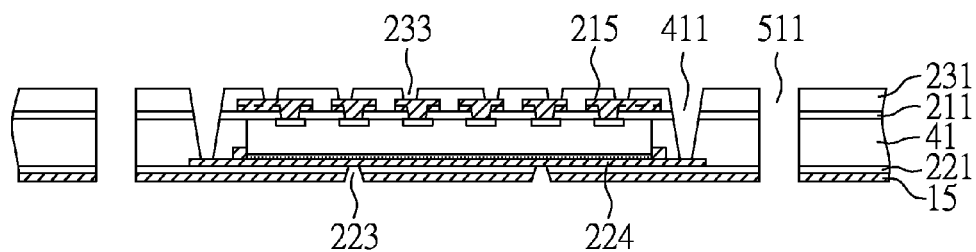

FIG. 14 is a cross-sectional view of the structure provided with second via openings 223, third via openings 233, slot openings 411 and through holes 511. Second via openings 223 extend through support plate 15 and second insulating layer 221 to expose selected portions of shielding lid 224. Third via openings 233 extend through third insulating layer 231 to expose selected portions of first conductive traces 215. Slot openings 411 extend through third insulating layer 231, first insulating layer 211 and core layer 41 to expose selected portions of shielding lid 224. Through holes 511 extend through third insulating layer 231, first insulating layer 211, core layer 41, second insulating layer 221 and support plate 15 in the vertical direction.

Figure 15:
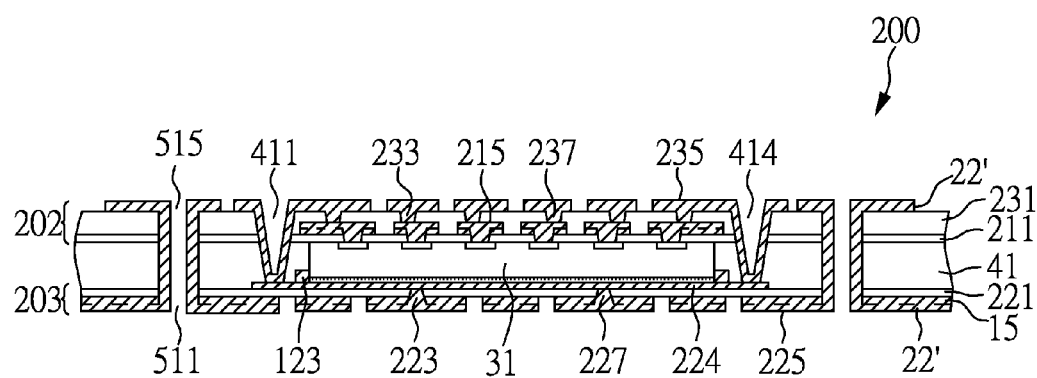

Referring now to FIG. 15, second conductive traces 225 and third conductive traces 235 are respectively formed on second and third insulating layers 221, 231 by depositing second plated layer 22' on support plate 15 and third insulating layer 231 and into second and third via openings 223, 233, and then patterning second plated layer 22' as well as support plate 15. Second conductive traces 225 extend from second insulating layer 221 in the downward direction, extend laterally on second insulating layer 221 and extend into second via openings 223 in the upward direction to form second conductive vias 227 in electrical contact with shielding lid 224. Third conductive traces 235 extend from third insulating layer 231 in the upward direction, extend laterally on third insulating layer 231 and extend into third via openings 233 in the downward direction to form third conductive vias 237 in electrical contact with first conductive traces 215. Also, second plated layer 22' is further deposited in slot openings 411 and through holes 511 to provide shielding slots 414 and plated through holes 515.

Accordingly, as shown in FIG. 15, wiring board 200 is accomplished and includes stopper 123, semiconductor device 31, core layer 41, shielding lid 224, shielding slots 414, dual build-up circuitries 202, 203 and plated through holes 515. First build-up circuitry 202 covers semiconductor device 31 and core layer 41 in the upward direction and includes first insulating layer 211, first conductive traces 215, third insulating layer 231 and third conductive traces 235. Second build-up circuitry 203 covers shielding lid 224 and core layer 41 in the downward direction and includes second insulating layer 221 and second conductive traces 225. Shielding slots 414 contact and extend from third conductive traces 235 to shielding lid 224 in the downward direction and are electrically connected to ground contact pads of semiconductor device 31 by first and third conductive traces 215, 235. Shielding lid 224 covers semiconductor device 31 in the downward direction and is electrically connected to ground contact pads of semiconductor device 31 by shielding slots 414, first and third conductive traces 215, 235. Plated through holes 515 are essentially shared by core layer 41, first build-up circuitry 202 and second build-up circuitry 203, and provide an electrical connection between second conductive traces 225 and third conductive traces 235.

[Embodiment 3]

FIGS. 16-21 are cross-sectional views showing a method of making yet another wiring board that includes shielding slots in electrical contact with a stopper in accordance with yet another embodiment of the present invention.

For purposes of brevity, any description in above Embodiments is incorporated herein insofar as the same is applicable, and the same description need not be repeated.

Figure 16:
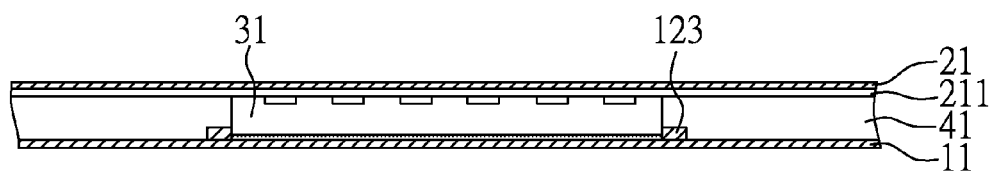
FIGS. 16-21 are cross-sectional views showing a method of making yet another wiring board that includes shielding slots in electrical contact with a stopper in accordance with yet another embodiment of the present invention.

FIG. 16 is a cross-sectional view of the structure which is manufactured by the same steps shown in FIGS. 1-3.

Figure 17:
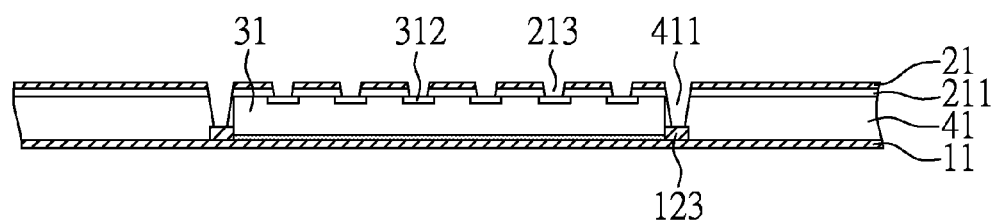

FIG. 17 is a cross-sectional view of the structure provided with first via openings 213 and slot openings 411. First via openings 213 extend through metal layer 21 and first insulating layer 211 to expose contact pads 312 of semiconductor device 31. Slot openings 411 extend through metal layer 21, first insulating layer 211 and core layer 41 to expose selected portions of stopper 123.

Figure 18:
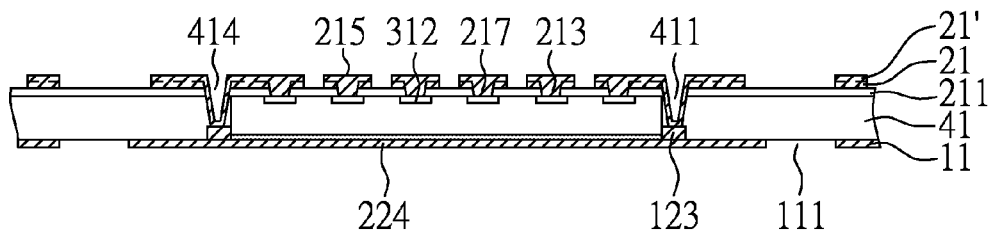

Referring now to FIG. 18, first conductive traces 215 are formed on first insulating layer 211 by depositing first plated layer 21' on metal layer 21 and into first via openings 213 and then patterning metal layer 21 and first plated layer 21' thereon. First plated layer 21' is also deposited in slot openings 411 to provide shielding slots 414. First conductive traces 215 provide signal routing for semiconductor device 31 and ground connection between ground contact pads of semiconductor device 31 and shielding slots 414 by first conductive traces 215. Also, openings 111 are formed through metal layer 11 at predetermined locations for subsequent formation of plated through holes. In this illustration, metal layer 11 serves as shielding lid 224 to provide vertical EMI shielding effect for semiconductor device 31.

Figure 19:
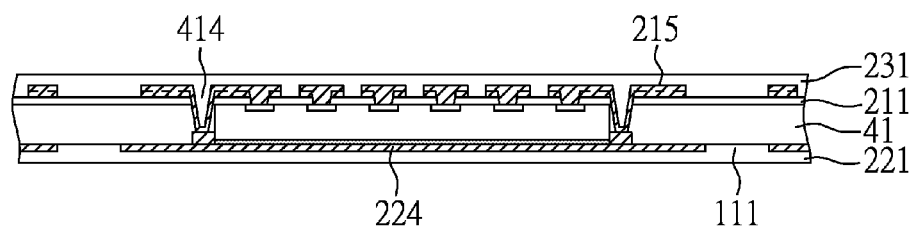

FIG. 19 is a cross-sectional view of the structure provided with second insulating layer 221 and third insulating layer 231. Second insulating layer 221 covers shielding lid 224 in the downward direction and fills openings 111. Third insulating layer 231 covers first insulating layer 211 and first conductive traces 215 in the upward direction and extends into shielding slots 414 from the open end of shielding slots 414.

Figure 20:
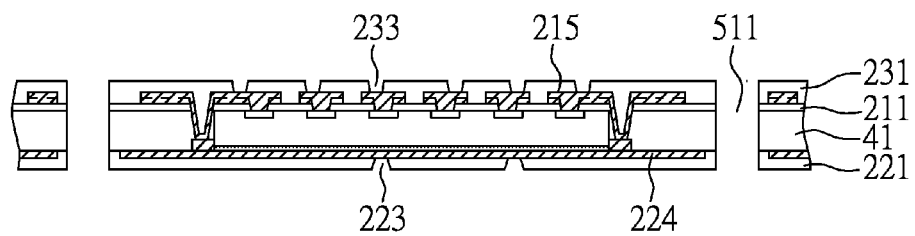

FIG. 20 is a cross-sectional view of the structure provided with second via openings 223, third via openings 233 and through holes 511. Second via openings 223 extend through second insulating layer 221 and are aligned with selected portions of shielding lid 224. Third via openings 233 extend through third insulating layer 231 and are aligned with selected portions of first conductive traces 215. Through holes 511 correspond to and are axially aligned with and concentrically positioned within openings 111, and extend through third insulating layer 231, first insulating layer 211, core layer 41 and second insulating layer 221 in the vertical direction.

Figure 21:
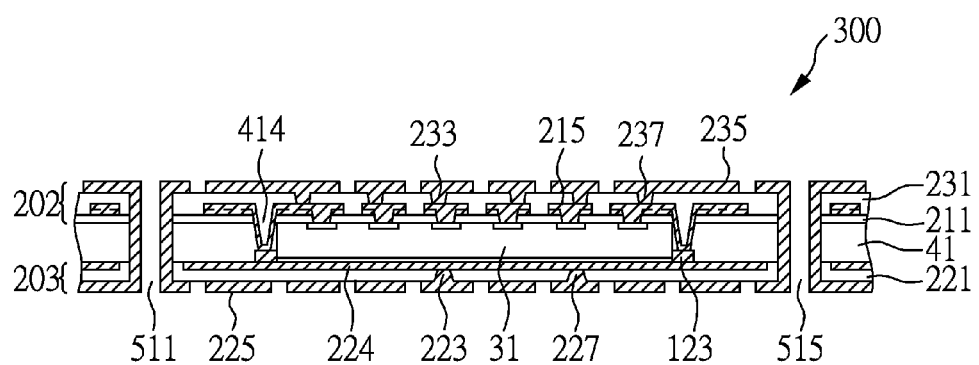

Referring now to FIG. 21, second conductive traces 225 and third conductive traces 235 are respectively formed on second and third insulating layers 221, 231 by metal deposition and patterning. Second conductive traces 225 extend from second insulating layer 221 in the downward direction, extend laterally on second insulating layer 221 and extend into second via openings 223 in the upward direction to form second conductive vias 227 in electrical contact with shielding lid 224. Third conductive traces 235 extend from third insulating layer 231 in the upward direction, extend laterally on third insulating layer 231 and extend into third via openings 233 in the downward direction to form third conductive vias 237 in electrical contact with first conductive traces 215. Also, plated through holes 515 are provided by metal deposition in through holes 511.

Accordingly, as shown in FIG. 21, wiring board 300 is accomplished, in which the combination of stopper 123 and shielding slots 414 can serve as a horizontal shield for semiconductor device 31, and shielding lid 224 can serve as a vertical shield for semiconductor device 31. Shielding slots 414 contact and extend from first conductive traces 215 to stopper 123 in the downward direction and are electrically connected to ground contact pads of semiconductor device 31 by first conductive traces 215. Shielding lid 224 covers semiconductor device 31 in the downward direction and is electrically connected to ground contact pads of semiconductor device 31 by stopper 123, shielding slots 414 and first conductive traces 215. Plated through holes 515 are essentially shared by core layer 41, first build-up circuitry 202 and second build-up circuitry 203, and provide an electrical connection between second conductive traces 225 and third conductive traces 235.

[Embodiment 4]

FIGS. 22-27 are cross-sectional views showing another method of making a wiring board that includes a stopper, a semiconductor device, a core layer, shielding slots and dual build-up circuitries in accordance with an embodiment of the present invention.

For purposes of brevity, any description in above Embodiments is incorporated herein insofar as the same is applicable, and the same description need not be repeated.

Figure 22:
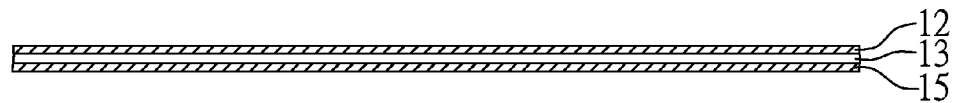
FIGS. 22-27 are cross-sectional views showing another method of making a wiring board that includes a stopper, a semiconductor device, a core layer, shielding slots and dual build-up circuitries in accordance with an embodiment of the present invention, in which FIGS. 22'-23' are cross-sectional views of another modified aspect corresponding to FIGS. 22-23.
Figure 23:
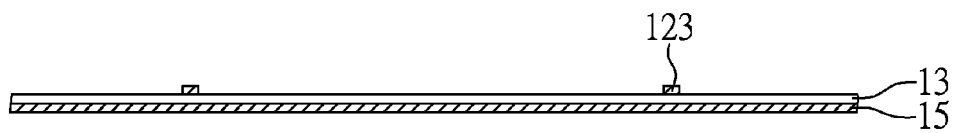
Figure 22:
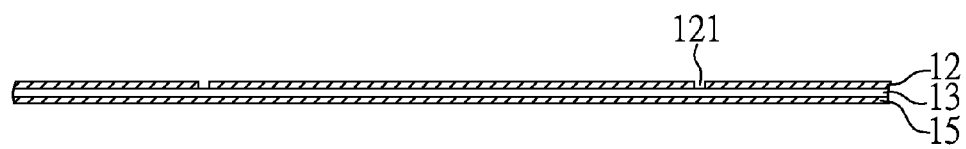
Figure 23:
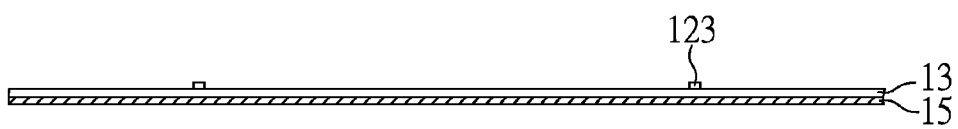

FIGS. 22 and 23 are cross-sectional views showing a process of forming a stopper on a dielectric layer in accordance with an embodiment of the present invention.

FIG. 22 is a cross-sectional view of a laminate substrate that includes metal layer 12, dielectric layer 13 and support plate 15. In this embodiment, dielectric layer 13 is sandwiched between metal layer 12 and support plate 15. However, support plate 15 may be omitted in some embodiments. Metal layer 12 is illustrated as a copper layer with a thickness of 35 microns. However, metal layer 12 can also be made of other various metal materials and is not limited to a copper layer. Besides, metal layer 12 can be deposited on dielectric layer 13 by numerous techniques including lamination, electroplating, electroless plating, evaporating, sputtering, and their combinations as a single layer or multiple layers, and preferably has a thickness in a range of 10 to 200 microns.

FIG. 23 is a cross-sectional view of the structure with stopper 123 formed on dielectric layer 13. Stopper 123 can be formed by removing selected portions of metal layer 12 using photolithography and wet etching.

FIGS. 22' and 23' are cross-sectional views showing an alternative process of forming a stopper on a dielectric layer.

FIG. 22' is a cross-sectional view of a laminate substrate with a set of cavities 121. The laminate substrate includes metal layer 12, dielectric layer 13 and support plate 15 as above mentioned, and cavities 121 are formed by removing selected portions of metal layer 12.

FIG. 23' is a cross-sectional view of the structure with stopper 123 formed on dielectric layer 13. Stopper 123 can be formed by dispensing or printing a photosensitive plastic material (e.g., epoxy, polyimide, etc.) or non-photosensitive material into cavities 121, followed by removing overall metal layer 12.

Figure 24:
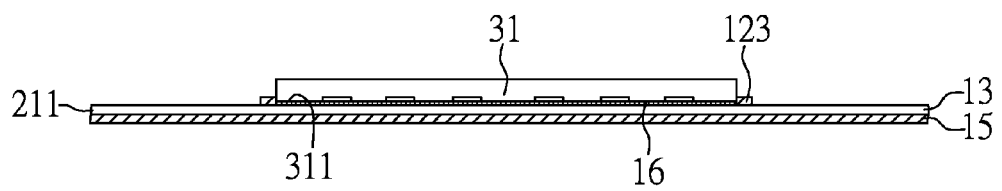

FIG. 24 is a cross-sectional view of the structure with semiconductor device 31 mounted on dielectric layer 13 using adhesive 16 that is sandwiched between and contacts dielectric layer 13 and semiconductor device 31. Semiconductor device 31 is attached onto dielectric layer 13 with its active surface 311 facing dielectric layer 13 that is considered first insulating layer 211. Stopper 123 extends from dielectric layer 13 and extends beyond active surface 311 of semiconductor device 31 in the upward direction and is in close proximity to peripheral edges of semiconductor device 31 to serve as a placement guide for semiconductor device 31.

Figure 25:
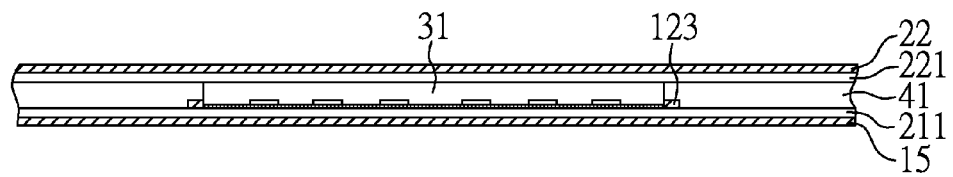

FIG. 25 is a cross-sectional view of the structure laminated with core layer 41, second insulating layer 221 and metal layer 22. Core layer 41 contacts and is laminated with semiconductor device 31, stopper 123 and first insulating layer 211. Second insulating layer 221 contacts and provides robust mechanical bonds between metal layer 22 and semiconductor device 31 and between metal layer 22 and core layer 41. Preferably, first insulating layer 211 and second insulating layer 221 are the same material.

Figure 26:
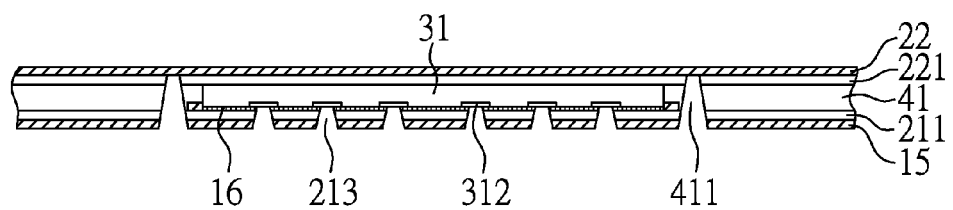

FIG. 26 is a cross-sectional view of the structure provided with first via openings 213 and slot openings 411. First via openings 213 extend through support plate 15, first insulating layer 211 and adhesive 16 to expose contact pads 312 of semiconductor device 31. Slot openings 411 extend through support plate 15, first insulating layer 211, core layer 41 and second insulating layer 221 to expose selected portions of metal layer 22.

Figure 27:
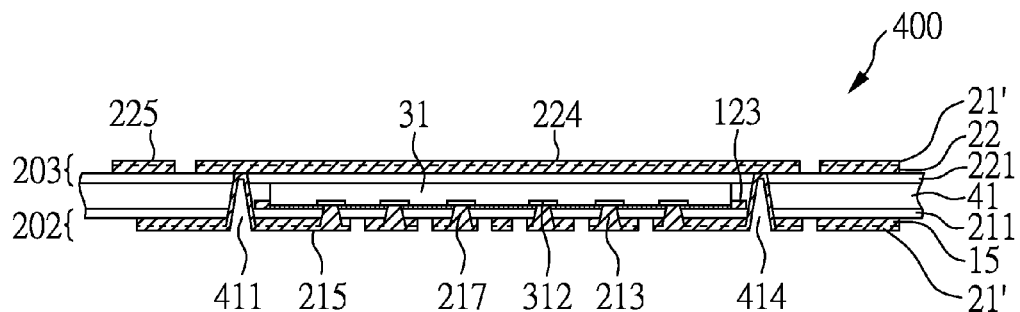
Figure 26:
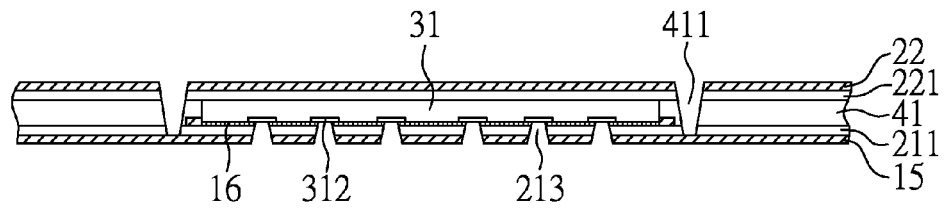
Figure 27:
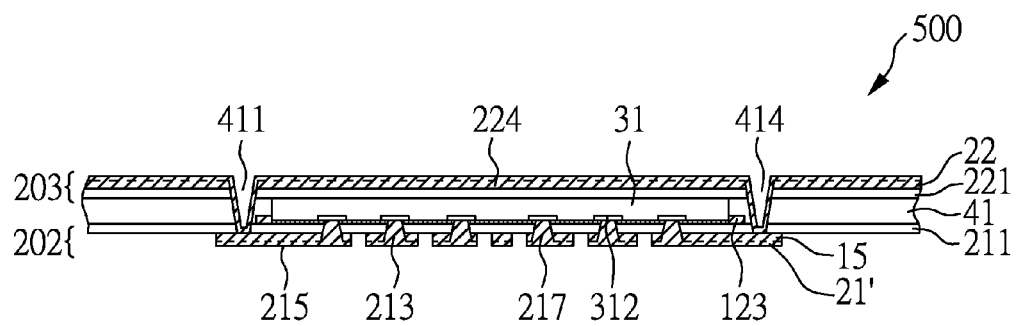

Referring now to FIG. 27, first conductive traces 215 are formed on first insulating layer 211 by depositing first plated layer 21' on support plate 15 and into first via openings 213, and then patterning support plate 15 as well as first plated layer 21' thereon. First conductive traces 215 extend from first insulating layer 211 in the downward direction, extend laterally on first insulating layer 211 and extend into first via openings 213 in the upward direction to form first conductive vias 217 in direct contact with contact pads 312. Also, first plated layer 21' is further deposited in slot openings 411 to provide shielding slots 414 and deposited on metal layer 22, followed by a patterning process of metal layer 22 and first plated layer 21' thereon to define shielding lid 224 and second conductive traces 225. Shielding slots 414 can serve as a horizontal shield for semiconductor device 31 and are electrically connected to ground contact pads of semiconductor device 31 by first conductive traces 215. Shielding lid 224 can serve as a vertical shield for semiconductor device 31 and is electrically connected to ground contact pads of semiconductor device 31 by shielding slots 414 and first conductive traces 215.

Accordingly, as shown in FIG. 27, wiring board 400 is accomplished and includes stopper 123, semiconductor device 31, core layer 41, shielding slots 414 and dual build-up circuitries 202, 203. First build-up circuitry 202 covers semiconductor device 31, stopper 123 and core layer 41 in the downward direction and includes first insulating layer 211 and first conductive traces 215. Second build-up circuitry 203 covers semiconductor device 31 and core layer 41 in the upward direction and includes second insulating layer 221 and shielding lid 224. Shielding slots 414 contact and extend from first conductive traces 215 to shielding lid 224 in the upward direction and laterally cover semiconductor device 31 and have an open end toward the downward direction. Shielding lid 224 covers semiconductor device 31 in the upward direction and laterally extends to peripheral edges of wiring board 400 outward.

FIGS. 26' and 27' are cross-sectional views showing an alternative aspect of forming shielding slots 414 in electrical contact with shielding lid 224 and first conductive traces 215.

FIG. 26' is a cross-sectional view of the structure provided with first via openings 213 and slot openings 411. The structure is similar to that illustrated in FIG. 26, except that slot openings 411 of this aspect extend through metal layer 22, second insulating layer 221, core layer 41 and first insulating layer 211 to expose selected portions of support plate 15.

FIG. 27' is a cross-sectional view of wiring board 500 which is accomplished by metal deposition and patterning to provide first conductive traces 215, shielding slots 414 and shielding lid 224. Wiring board 500 is similar to that illustrated in FIG. 27, except that shielding slots 414 have an open end toward the upward direction and shielding lid 224 extends laterally to peripheral edges of wiring board 500.

[Embodiment 5]

Figure 28:
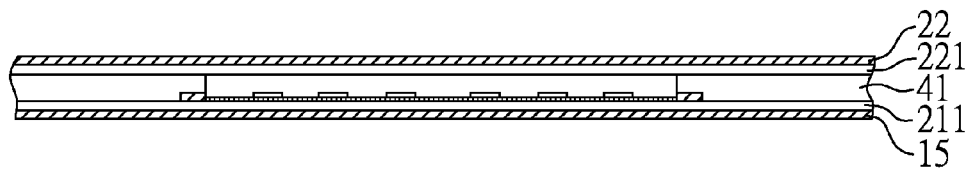
FIGS. 28-30 are cross-sectional views showing a method of making another wiring board that includes shielding slots in electrical contact with a stopper and a shielding lid in accordance with another embodiment of the present invention.
Figure 29:
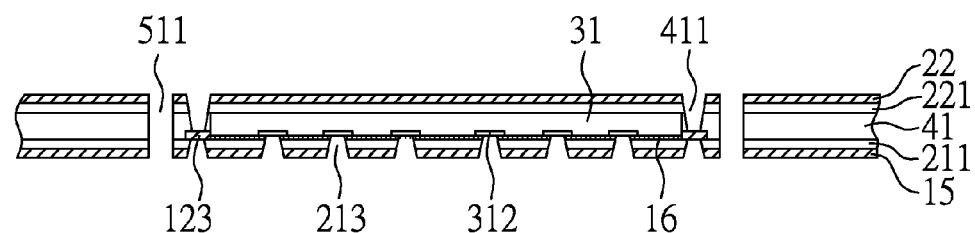
Figure 30:
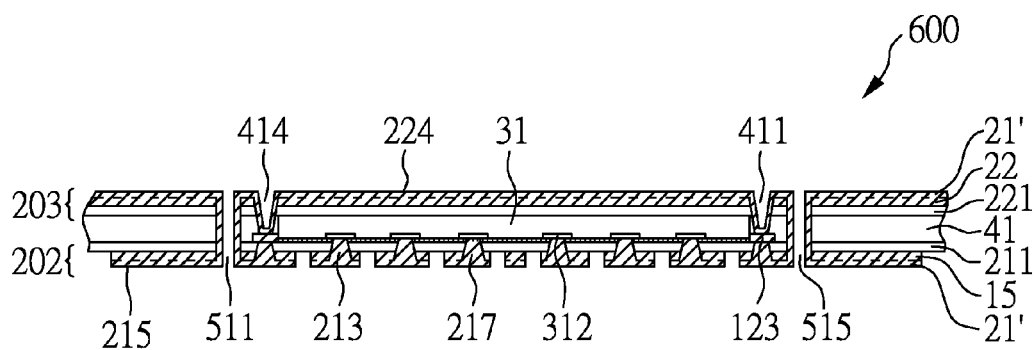

FIGS. 28-30 are cross-sectional views showing a method of making another wiring board that includes shielding slots in electrical contact with a stopper and a shielding lid in accordance with another embodiment of the present invention.

For purposes of brevity, any description in above Embodiments is incorporated herein insofar as the same is applicable, and the same description need not be repeated.

FIG. 28 is a cross-sectional view of the structure which is manufactured by the same steps shown in FIGS. 22-25.

FIG. 29 is a cross-sectional view of the structure provided with first via openings 213, slot openings 411 and through holes 511. First via openings 213 extend through support plate 15, first insulating layer 211 and adhesive 16 to expose contact pads 312 of semiconductor device 31 and selected portions of stopper 123 in the downward direction. Slot openings 411 extend through metal layer 22, second insulating layer 221 and core layer 41 to expose selected portions of stopper 123 in the upward direction. Through holes 511 extend through metal layer 22, second insulating layer 221, core layer 41, first insulating layer 211 and support plate 15 in the vertical direction.

Referring now to FIG. 30, wiring board 600 is accomplished by metal deposition and patterning to provide first conductive traces 215, shielding slots 414, shielding lid 224 and plated through holes 515. First conductive traces 215 are formed on first insulating layer 211 by depositing first plated layer 21' on support plate 15 and into first via openings 213, and then patterning support plate 15 as well as first plated layer 21' thereon. First conductive traces 215 extend from first insulating layer 211 in the downward direction, laterally extend on first insulating layer 211, and extend into first via openings 213 in the upward direction to form first conductive vias 217 in electrical contact with contact pads 312 and stopper 123.

Also, first plated layer 21' is further deposited in slot openings 411 and through holes 511 to provide shielding slots 414 and plated through holes 515 and deposited on metal layer 22. In this illustration, the combination of metal layer 22 and first plated layer 21' is considered shielding lid 224 to provide vertical shielding effect for semiconductor device 31. Shielding slots 414 extend from shielding lid 224 to stopper 123 in the downward direction and are electrically connected to ground contact pads of semiconductor device 31 by stopper 123 and first conductive traces 215. Shielding lid 224 extends from second insulating layer 221 in the upward direction and laterally extends to peripheral edges of wiring board 600 outward and is electrically connected to ground contact pads of semiconductor device 31 by shielding slots 414, stopper 123 and first conductive traces 215. Also, plated through holes 515 provide another electrical connection path between shielding lid 224 and first build-up circuitry 202 and between shielding slots 414 and first build-up circuitry 202.

[Embodiment 6]

Figure 31:
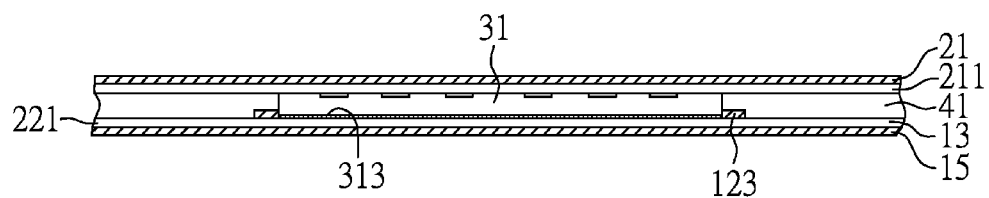
Figure 32:
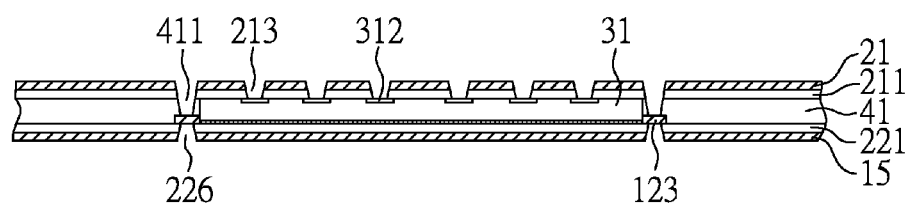
Figure 33:
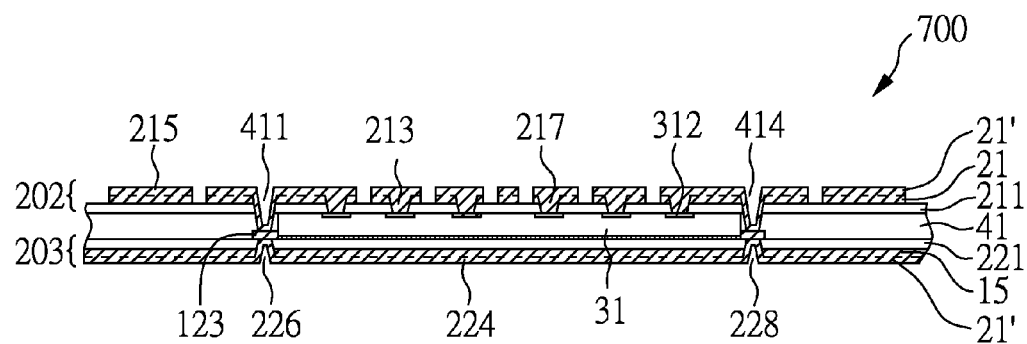
Figure 33:
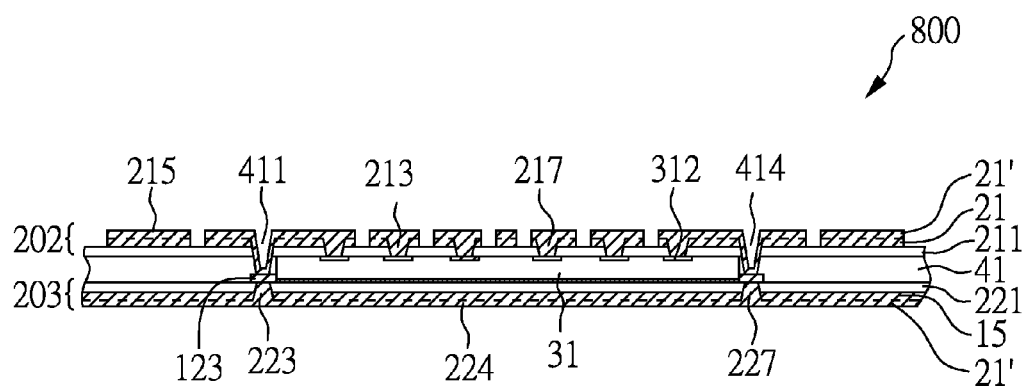

FIGS. 31-33 are cross-sectional views showing a method of making yet another wiring board in which a shielding lid is electrically connected to first build-up circuitry by conductive trenches in contact with a stopper in accordance with yet another embodiment of the present invention.

For purposes of brevity, any description in above Embodiments is incorporated herein insofar as the same is applicable, and the same description need not be repeated.

FIG. 31 is a cross-sectional view of the structure which is manufactured by the same steps shown in FIGS. 22-25, except that semiconductor device 31 is mounted on dielectric layer 13 with its inactive surface 313 facing dielectric layer 13, and first insulating layer 211 as well as metal layer 21 are provided to cover semiconductor device 31 and core layer 41 in the upward direction. In this illustration, stopper 123 extends from dielectric layer 13 and extends beyond inactive surface 313 of semiconductor device 31 in the upward direction. Core layer 41 contacts and is laminated with semiconductor device 31, stopper 123 and dielectric layer 13 that is considered second insulating layer 221. First insulating layer 211 contacts and provides robust mechanical bonds between metal layer 21 and semiconductor device 31 and between metal layer 21 and core layer 41.

Figure 32A:
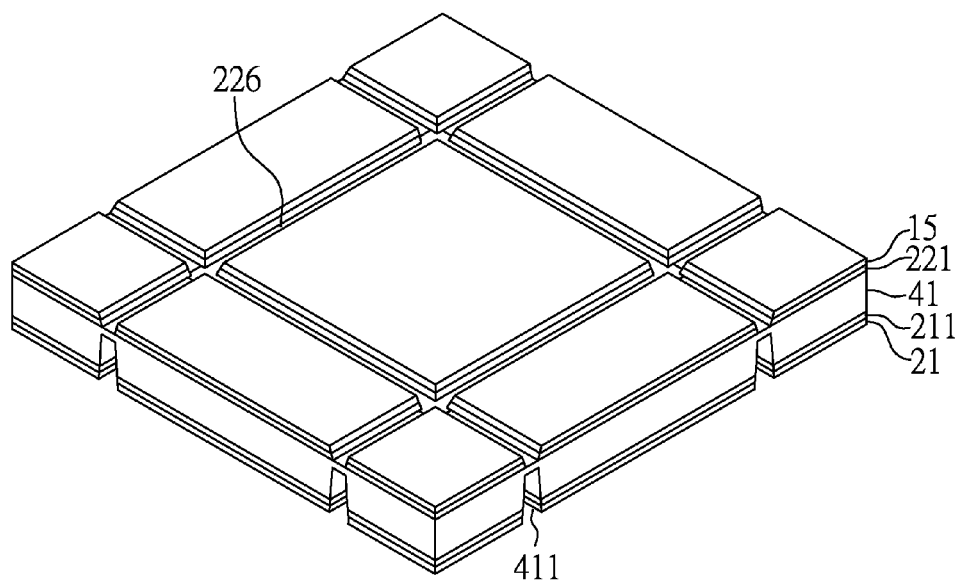
FIG. 32A is a bottom perspective views corresponding to FIG. 32.

FIGS. 32 and 32A are cross-sectional and bottom perspective views, respectively, of the structure provided with first via openings 213, trench openings 226 and slot openings 411. First via openings 213 extend through metal layer 21 and first insulating layer 211 to expose contact pads 312 of semiconductor device 31. Trench openings 226 extend through support plate 15 and second insulating layer 221 to expose selected portions of stopper 123 in the downward direction. Slot openings 411 extend through metal layer 21, first insulating layer 211 and core layer 41 to expose selected portions of stopper 123 in the upward direction. As shown in FIG. 32A, trench openings 226 are formed by mechanically cutting through support plate 15 and second insulating layer 221 along four cutting lines aligned with four sides of stopper 123.

FIG. 33 is a cross-sectional view of wiring board 700 which is accomplished by metal deposition and patterning to provide first conductive traces 215, shielding slots 414, shielding lid 224 and conductive trenches 228. First conductive traces 215 are formed on first insulating layer 211 by depositing first plated layer 21' on metal layer 21 and into first via openings 213, and then patterning metal layer 21 as well as first plated layer 21' thereon. Also, first plated layer 21' is further deposited in slot openings 411 and trench openings 226 to provide shielding slots 414 and conductive trenches 228 and deposited on support plate 15. In this illustration, the combination of support plate 15 and first plated layer 21' is considered shielding lid 224. The combination of shielding slots 414 and stopper 123 can serve as a horizontal shield for semiconductor device 31 and is electrically connected to ground contact pads of semiconductor device 31 by first conductive traces 215. Shielding lid 224 can serve as a vertical shield for semiconductor device 31 and is electrically connected to ground contact pads of semiconductor device 31 by conductive trenches 228, stopper 123, shielding slots 414 and first conductive traces 215.

As another aspect, shielding lid 224 may be electrically connected to stopper 123 by second conductive vias 227, as shown in FIG. 33'. Accordingly, in wiring board 800, shielding lid 224 is electrically connected to ground contact pads of semiconductor device 31 by second conductive vias 227, stopper 123, shielding slots 414 and first conductive traces 215.

[Embodiment 7]

Figure 34:
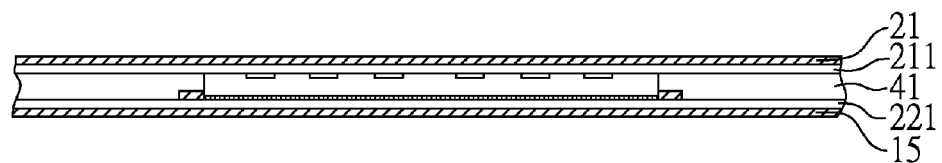
FIGS. 34-36 are cross-sectional views showing a method of making further another wiring board in which a shielding lid is electrically connected to first build-up circuitry by plated through holes in accordance with further another embodiment of the present invention.
Figure 35:
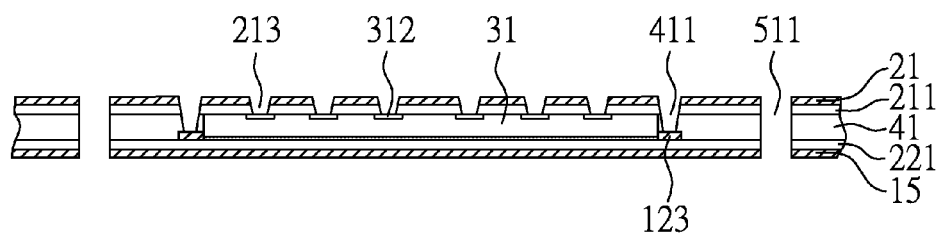
Figure 36:
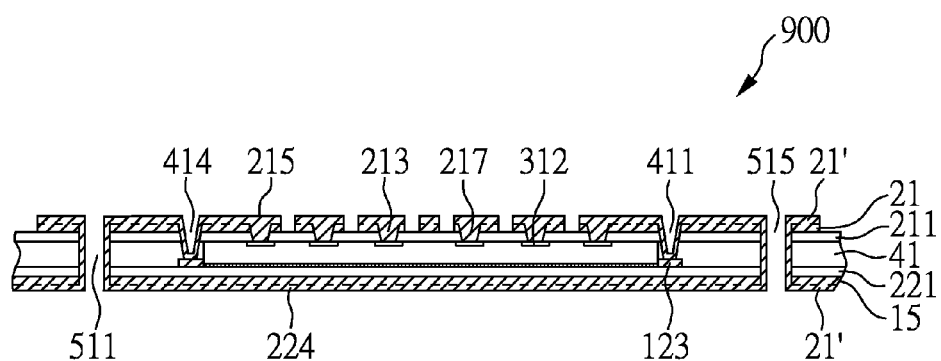

FIGS. 34-36 are cross-sectional views showing a method of making further another wiring board in which a shielding lid is electrically connected to first build-up circuitry by plated through holes in accordance with further another embodiment of the present invention.

For purposes of brevity, any description in above Embodiments is incorporated herein insofar as the same is applicable, and the same description need not be repeated.

FIG. 34 is a cross-sectional view of the structure which is the same as that illustrated in FIG. 31.

FIG. 35 is a cross-sectional view of the structure provided with first via openings 213, slot openings 411 and through holes 511. First via openings 213 extend through metal layer 21 and first insulating layer 211 to expose contact pads 312 of semiconductor device 31. Slot openings 411 extend through metal layer 21, first insulating layer 211 and core layer 41 to expose selected portions of stopper 123 in the upward direction. Through holes 511 extend through metal layer 21, first insulating layer 211, core layer 41, second insulating layer 221 and support plate 15 in the vertical direction.

FIG. 36 is a cross-sectional view of wiring board 900 which is accomplished by metal deposition and patterning to provide first conductive traces 215, shielding slots 414, shielding lid 224 and plated through holes 515. First conductive traces 215 are formed on first insulating layer 211 by depositing first plated layer 21' on metal layer 21 and into first via openings 213, and then patterning metal layer 21 as well as first plated layer 21' thereon. Also, first plated layer 21' is further deposited in slot openings 411 and through holes 511 to provide shielding slots 414 and plated through holes 515 and deposited on support plate 15. In this illustration, the combination of support plate 15 and first plated layer 21' is considered shielding lid 224. The combination of shielding slots 414 and stopper 123 can serve as a horizontal shield for semiconductor device 31 and is electrically connected to ground contact pads of semiconductor device 31 by first conductive traces 215. Shielding lid 224 can serve as a vertical shield for semiconductor device 31 and is electrically connected to ground contact pads of semiconductor device 31 by plated through holes 515 and first conductive traces 215.

[Embodiment 8]

Figure 37:
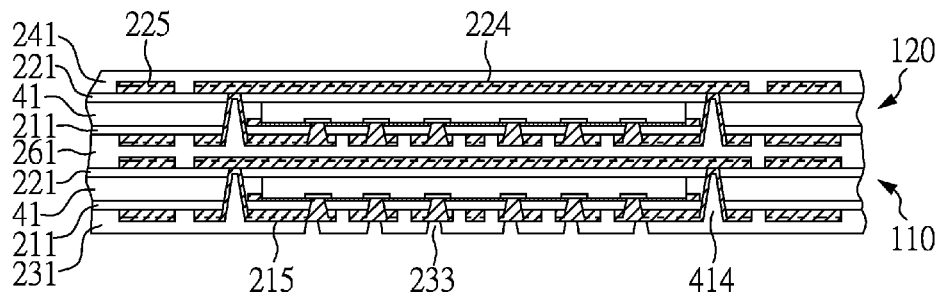
FIGS. 37-39 are cross-sectional views showing a method of making a three-dimensional stacking module that includes plural wiring boards in face-to-back stacking in accordance with one embodiment of the present invention.
Figure 38:
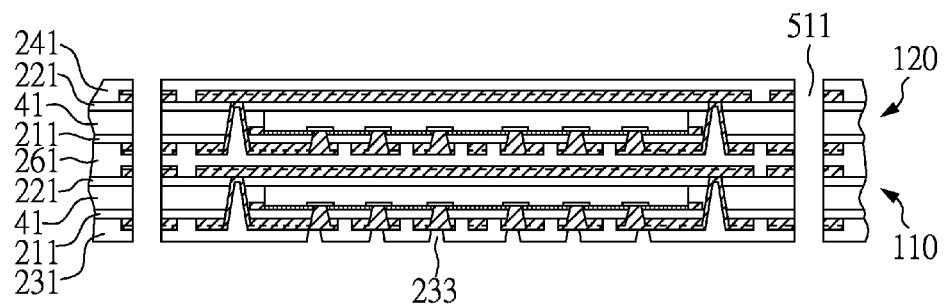
Figure 39:
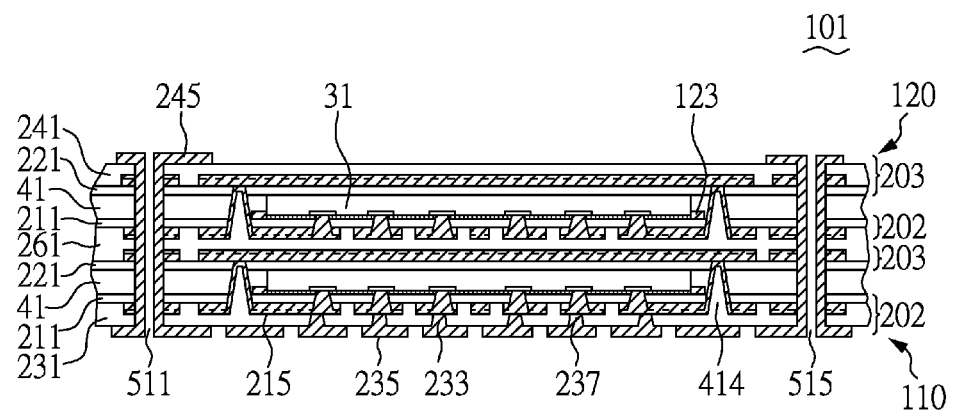

FIGS. 37-39 are cross-sectional views showing a method of making a three-dimensional stacking module that includes plural wiring boards in face-to-back stacking in accordance with one embodiment of the present invention.

For purposes of brevity, any description in above Embodiments is incorporated herein insofar as the same is applicable, and the same description need not be repeated.

FIG. 37 is a cross-sectional view of the structure with interlayer dielectric 261 sandwiched between two neighboring wiring boards 110, 120. Wiring boards 110, 120 are the same as illustrated in FIG. 27, except that wiring boards 110, 120 are respectively further provided with third insulating layer 231 and fourth insulating layer 241. Wiring boards 110, 120 are vertically stacked and bonded to one another using interlayer dielectric 261 that contacts and is sandwiched between second insulating layer 221/shielding lid 224/second conductive traces 225 of wiring board 110 and first insulating layer 211/first conductive traces 215 of wiring board 120. Third insulating layer 231 covers and contacts first insulating layer 211 and first conductive traces 215 of wiring board 110 in the downward direction, and includes third via openings 233 aligned with selected portions of first conductive traces 215. Fourth insulating layer 241 covers and contacts second insulating layer 221, shielding lid 224 and second conductive traces 225 of wiring board 120 in the upward direction.

FIG. 38 is a cross-sectional view of the structure with through holes 511. Through holes 511 extend through wiring boards 110, 120 and interlayer dielectric 261 in the vertical direction.

Referring now to FIG. 39, wiring boards 110, 120 are respectively provided with third conductive traces 235 and fourth conductor traces 245. Third conductive traces 235 extend from third insulating layer 231 in the downward direction, extend laterally on third insulating layer 231, and extend into third via openings 233 to form third conductive vias 237 in electrical contact with first conductive traces 215. Fourth conductive traces 245 extend from fourth insulating layer 241 in the upward direction and extend laterally on fourth insulating layer 241. Also shown in FIG. 39 are plated through holes 515 provided by metal deposition in through holes 511. Accordingly, stacking module 101 is accomplished and includes multiple wiring boards 110, 120, interlayer dielectric 261 and plated through holes 515. Each wiring board 110, 120 includes stopper 123, semiconductor device 31, core layer 41, shielding slots 414, first build-up circuitry 202 and second build-up circuitry 203. Plated through holes 515 are essentially shared by wiring boards 110, 120 and extend through interlayer dielectric 261 and wiring boards 110, 120 to provide electrical connection between wiring boards 110, 120.

[Embodiment 9]

Figure 40:
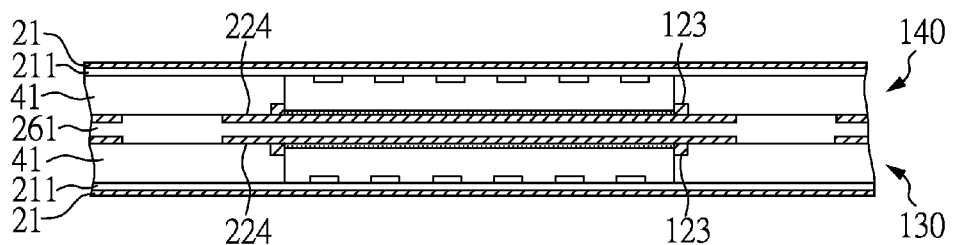
FIGS. 40-42 are cross-sectional views showing a method of making another three-dimensional stacking module that includes plural wiring boards in back-to-back stacking in accordance with another embodiment of the present invention.
Figure 41:
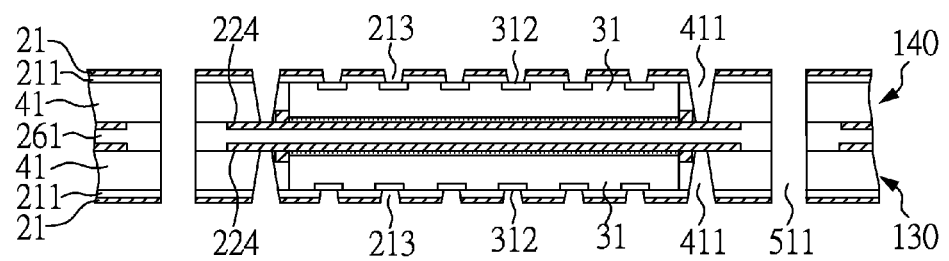
Figure 42:
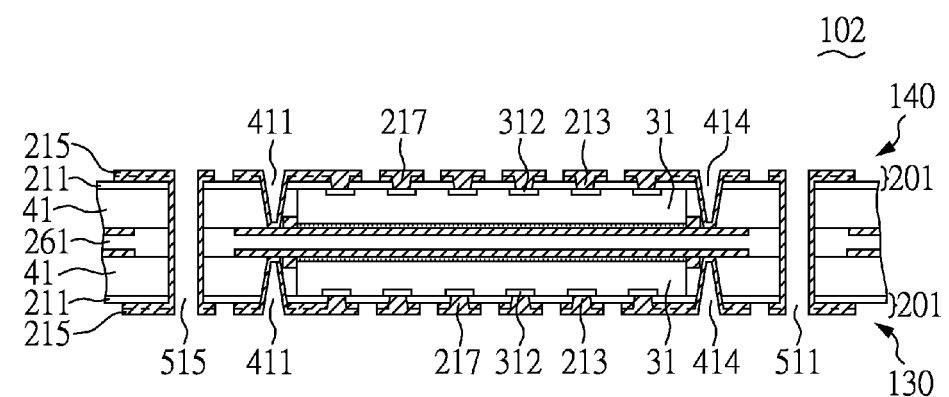

FIGS. 40-42 are cross-sectional views showing a method of making another three-dimensional stacking module that includes plural wiring boards in back-to-back stacking in accordance with another embodiment of the present invention.

For purposes of brevity, any description in above Embodiments is incorporated herein insofar as the same is applicable, and the same description need not be repeated.

FIG. 40 is a cross-sectional view of the structure with interlayer dielectrics 261 sandwiched between plural wiring boards 130, 140. Wiring boards 130, 140 are the same as illustrated in FIG. 3 and are vertically stacked in back-to back manner and bonded to one another using interlayer dielectric 261 that is sandwiched between wiring boards 130, 140 and contacts shielding lid 224 of each wiring board 130, 140.

FIG. 41 is a cross-sectional view of the structure with first via openings 213, slot openings 411 and through holes 511. First via openings 213 extend through metal layer 21 and first insulating layer 211 to expose contact pads 312 of semiconductor device 31 in each wiring board 130, 140. Slot openings 411 extend through metal layer 21, first insulating layer 211 and core layer 41 to expose selected portions of shielding lid 224 in each wiring board 130, 140. Through holes 511 extend through wiring boards 130, 140 and interlayer dielectric 261 in the vertical direction.

Referring now to FIG. 42, each wiring board 130, 140 is provided with first conductive traces 215 by metal deposition and patterning. First conductive traces 215 extend vertically from first insulating layer 211, extend laterally on first insulating layer 211, and extend into first via openings 213 to form first conductive vias 217 in electrical contact with contact pads 312 of semiconductor device 31. Also shown in FIG. 42 are shielding slots 414 and plated through holes 515 provided by metal deposition in slot openings 411 and through holes 511. Accordingly, stacking module 102 is accomplished and includes wiring boards 130, 140, interlayer dielectric 261 and plated through holes 515. Each wiring board 130, 140 includes stopper 123, shielding lid 224, shielding slots 414, semiconductor device 31, core layer 41 and build-up circuitry 201. Plated through holes 515 are essentially shared by wiring boards 130, 140 and extend through interlayer dielectrics 261 and wiring boards 130, 140 to provide electrical connection between wiring boards 130, 140.

The wiring boards and three-dimensional stacking modules described above are merely exemplary. Numerous other embodiments are contemplated. In addition, the embodiments described above can be mixed-and-matched with one another and with other embodiments depending on design and reliability considerations. The wiring board can include multiple sets of shielding slots and shielding lids arranged in an array for multiple side-by-side semiconductor devices and the build-up circuitries can include additional conductive traces to accommodate additional semiconductor devices, shielding slots and shielding lids. Likewise, the wiring board can include multiple sets of stoppers to accommodate multiple additional semiconductor devices.

The semiconductor device can be a packaged or unpackaged chip. Furthermore, the semiconductor device can be a bare chip, or a wafer level packaged die, etc. The stopper, the shielding lid, and the area defined by the shielding slots can be customized to accommodate a single semiconductor device. For instance, the stopper can have a pattern that defines a square or rectangular area with the same or similar topography as a single semiconductor device. Each set of four shielding slots can define a square or rectangular area with the same or similar topography as a single semiconductor device. Likewise, the shielding lid also can be customized to have a shape with the same or similar topography as a single semiconductor device.

The term "adjacent" refers to elements that are integral (single-piece) or in contact (not spaced or separated from) with one another. For instance, the contact pads are adjacent to the first conductive traces, but not adjacent to the second conductive traces.

The term "overlap" refers to above and extending within a periphery of an underlying element. Overlap includes extending inside and outside the periphery or residing within the periphery. For instance, in the position that the first build-up circuitry faces the upward direction, the first build-up circuitry overlaps the semiconductor device since an imaginary vertical line intersects the first build-up circuitry and the semiconductor device, regardless of whether another element such as the adhesive is between the first build-up circuitry and the semiconductor device and is intersected by the line, and regardless of whether another imaginary vertical line intersects the first build-up circuitry but not the semiconductor device (outside the periphery of the semiconductor device). Likewise, the first build-up circuitry overlaps the core layer and the core layer is overlapped by the first build-up circuitry. Moreover, overlap is synonymous with over and overlapped by is synonymous with under or beneath.

The term "contact" refers to direct contact. For instance, the first conductive vias contact the contact pads of the semiconductor device but the second conductive vias do not contact the contact pads of the semiconductor device.

The term "cover" refers to incomplete and complete coverage in a vertical and/or lateral direction. For instance, in the position that the first build-up circuitry faces the upward direction, the first build-up circuitry covers the semiconductor device in the upward direction regardless of whether another element such as the adhesive is between the semiconductor device and the first build-up circuitry.

The term "layer" refers to patterned and un-patterned layers. For instance, the metal layer disposed on the dielectric layer can be an un-patterned blanket sheet before photolithography and wet etching. Furthermore, a layer can include stacked layers.

The phrase "aligned with" refers to relative position between elements regardless of whether elements are spaced from or adjacent to one another or one element is inserted into and extends into the other element. For instance, the stopper is laterally aligned with the semiconductor device since an imaginary horizontal line intersects the stopper and the semiconductor device, regardless of whether another element is between the stopper and the semiconductor device and is intersected by the line, and regardless of whether another imaginary horizontal line intersects the semiconductor device but not the stopper or intersects the stopper but not the semiconductor device. Likewise, the shielding slots are laterally aligned with the semiconductor device, the first via opening is aligned with the contact pads of the semiconductor device, and the shielding lid is aligned with the semiconductor device.

The phrase "in close proximity to" refers to a gap between elements not being wider than the maximum acceptable limit. As known in the art, when the gap between the semiconductor device and the stopper is not narrow enough, the location error of the semiconductor device due to the lateral displacement of the semiconductor device within the gap may exceed the maximum acceptable error limit. Once the location error of the semiconductor device goes beyond the maximum limit, it is impossible to align the contact pad with a laser beam, resulting in the electrical connection failure between the semiconductor device and the build-up circuitry. According to the pad size of the semiconductor device, those skilled in the art can ascertain the maximum acceptable limit for a gap between the semiconductor device and the stopper through trial and error to prevent the electrical connection failure between the semiconductor device and the build-up circuitry. Thereby, the description "the stopper is in close proximity to the peripheral edges of the semiconductor device" means that the gap between the peripheral edges of the semiconductor device and the stopper is narrow enough to prevent the location error of the semiconductor device from exceeding the maximum acceptable error limit.

The phrases "mounted on", "attached to", "attached on", "attached onto", "laminated on" and "laminated with" include contact and non-contact with a single or multiple support element(s). For instance, the semiconductor device can be mounted on the shielding lid regardless of whether it contacts the shielding lid or is separated from the shielding lid by an adhesive.

The phrases "electrical connection" or "electrically connects" and "electrically connected" refer to direct and indirect electrical connection. For instance, the plated through hole provides an electrical connection for first conductive trace regardless of whether it is adjacent to the first conductive trace or electrically connected to the first conductive trace by the third conductive trace.

The term "above" refers to upward extension and includes adjacent and non-adjacent elements as well as overlapping and non-overlapping elements. For instance, in the position that the first build-up circuitry faces the downward direction, the stopper extends above, is adjacent to and protrudes from the first insulating layer.

The term "below" refers to downward extension and includes adjacent and non-adjacent elements as well as overlapping and non-overlapping elements. For instance, in the position that the first build-up circuitry faces the downward direction, the first build-up circuitry extends below the semiconductor device in the downward direction regardless of whether the first build-up circuitry is adjacent to the semiconductor device.

The "first vertical direction" and "second vertical direction" do not depend on the orientation of the wiring board, as will be readily apparent to those skilled in the art. For instance, the active surface of the semiconductor device faces the first vertical direction and the inactive surface of the semiconductor device faces the second vertical direction regardless of whether the wiring board is inverted. The first end of the shielding slot or plated through hole faces the first vertical direction, and the second end of the shielding slot or plated through hole faces the second vertical direction. Likewise, the stopper is "laterally" aligned with the semiconductor device in a lateral plane regardless of whether the wiring board is inverted, rotated or slanted. Thus, the first and second vertical directions are opposite one another and orthogonal to the lateral directions, and a lateral plane orthogonal to the first and second vertical directions intersects laterally aligned elements. Furthermore, the first vertical direction is the downward direction and the second vertical direction is the upward direction in the position that the active surface of the semiconductor device faces the downward direction, and the first vertical direction is the upward direction and the second vertical direction is the downward direction in the position that the active surface of the semiconductor device faces the upward direction.

The wiring board and the three-dimensional stacking module using the same according to the present invention have numerous advantages. The shielding slots and the shielding lid can respectively serve as horizontal and vertical EMI shields for semiconductor device to minimize electromagnetic interference. The signal routing provided by the build-up circuitry is advantageous for high I/O and high performance applications due to the high routing capability of the build-up circuitry. The stopper can be optionally provided in the wiring board based on actual demand. For instance, the stopper can be a perfect placement guide for the semiconductor device to be shielded. As the semiconductor device is bonded to the build-up circuitry or the shielding lid by adhesive, any movement due to placement error or adhesive reflow during curing can be avoided. Therefore, the wiring board and the three-dimensional stacking module are reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

Although the present invention has been explained in relation to its preferred embodiment, it is to be understood that many other possible modifications and variations can be made without departing from the spirit and scope of the invention as hereinafter claimed.

What is claimed is:

1. A wiring board with an embedded device and electromagnetic shielding, comprising:
    a shielding lid;
    a semiconductor device that is mounted on the shielding lid by an adhesive and includes an active surface with a plurality of contact pads thereon and an inactive surface opposite to the active surface, wherein the active surface faces a first vertical direction away from the shielding lid and the inactive surface faces a second vertical direction toward the shielding lid;
    a stopper that serves as a placement guide for the semiconductor device and extends from the shielding lid in the first vertical direction and is in close proximity to and laterally aligned with the peripheral edges of the semiconductor device;
    a core layer that laterally covers the semiconductor device in lateral directions orthogonal to the vertical directions;
    a first build-up circuitry that covers the semiconductor device and the core layer from the first vertical direction and is electrically connected to the contact pads of the semiconductor device through first conductive vias; and
    shielding slots that extend through the core layer and laterally cover the semiconductor device and laterally extend beyond peripheral edges of the semiconductor device outward, wherein the shielding slots and the shielding lid are electrically connected to at least one of the contact pads for grounding through the first build-up circuitry.

2. The wiring board of claim 1, further comprising:
    a second build-up circuitry that covers the shielding lid and the core layer from the second vertical direction; and
    a plated through hole that extends through the core layer to provide an electrical connection between the first build-up circuitry and the second build-up circuitry.

3. The wiring board of claim 1, wherein the shielding slots extend from the first build-up circuitry to the shielding lid in the second vertical direction.

4. The wiring board of claim 1, wherein the shielding slots extend from the first build-up circuitry to the stopper in the second vertical direction.

5. The wiring board of claim 1, wherein each of the shielding slots is a continuous metallized slot and laterally extends to peripheral edges of the wiring board outward.

6. The wiring board of claim 1, wherein the shielding lid is a continuous metal layer and laterally extends beyond the peripheral edges of the semiconductor device outward.

7. The wiring board of claim 1, wherein the stopper include a continuous or discontinuous strip or an array of posts.

8. The wiring board of claim 1, wherein a gap in between the semiconductor device and the stopper is in a range of 0.001 to 1 mm.

9. The wiring board of claim 1, wherein the stopper has a height in a range of 10 to 200 microns.

10. A wiring board with an embedded device and electromagnetic shielding, comprising:
    a semiconductor device that includes an active surface with a plurality of contact pads thereon and an inactive surface, wherein the active surface faces a first vertical direction and the inactive surface faces a second vertical direction opposite the first vertical direction;
    a stopper that serves as a placement guide for the semiconductor device and is in close proximity to and laterally aligned with the peripheral edges of the semiconductor device;
    a core layer that laterally covers the semiconductor device in lateral directions orthogonal to the vertical directions;
    a first build-up circuitry that covers the semiconductor device and the core layer from the first vertical direction and is electrically connected to the contact pads of the semiconductor device through first conductive vias;
    a second build-up circuitry that covers the semiconductor device and the core layer from the second vertical direction and includes a shielding lid that is aligned with the semiconductor device; and
    shielding slots that extend through the core layer and laterally cover the semiconductor device, laterally extend beyond peripheral edges of the semiconductor device outward, and extend from the first build-up circuitry to the stopper in the second vertical direction, wherein the shielding lid and the shielding slots are electrically connected to at least one of the contact pads for grounding through the first build-up circuitry, wherein the shielding lid is electrically connected to the first build-up circuitry through the shielding slots, the stopper and a second conductive via of the second build-up circuitry.

11. The wiring board of claim 10, wherein the shielding lid is electrically connected to the first build-up circuitry through a plated through hole that extends through the core layer 12. A wiring board with an embedded device and electromagnetic shielding, comprising:
    a semiconductor device that includes an active surface with a plurality of contact pads thereon and an inactive surface, wherein the active surface faces a first vertical direction and the inactive surface faces a second vertical direction opposite the first vertical direction;
    a stopper that serves as a placement guide for the semiconductor device and is in close proximity to and laterally aligned with the peripheral edges of the semiconductor device;
    a core layer that laterally covers the semiconductor device in lateral directions orthogonal to the vertical directions;
    a first build-up circuitry that covers the semiconductor device and the core layer from the first vertical direction and is electrically connected to the contact pads of the semiconductor device through first conductive vias;
    a second build-up circuitry that covers the semiconductor device and the core layer from the second vertical direction and includes a shielding lid that is aligned with the semiconductor device; and
    shielding slots that extend through the core layer and laterally cover the semiconductor device, laterally extend beyond peripheral edges of the semiconductor device outward, and extend from the first build-up circuitry to the stopper in the second vertical direction, wherein the shielding lid and the shielding slots are electrically connected to at least one of the contact pads for grounding through the first build-up circuitry, wherein the shielding lid is electrically connected to the first build-up circuitry through the shielding slots, the stopper and a conductive trench of the second build-up circuitry.

13. The wiring board of claim 12, wherein the shielding lid is electrically connected to the first build-up circuitry through a plated through hole that extends through the core layer.

* * * * *